(12) United States Patent
Jin et al.

(10) Patent No.: US 12,218,449 B2
(45) Date of Patent: Feb. 4, 2025

(54) ELECTRICAL CONNECTOR

(71) Applicant: LOTES CO., LTD, Keelung (TW)

(72) Inventors: Zuo Feng Jin, Keelung (TW); Chang Wei Huang, Keelung (TW); Chien Chih Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 401 days.

(21) Appl. No.: 17/900,948

(22) Filed: Sep. 1, 2022

(65) Prior Publication Data
US 2023/0075216 A1 Mar. 9, 2023

(30) Foreign Application Priority Data

Sep. 6, 2021 (CN) .......................... 202111037210.4
Sep. 27, 2021 (CN) .......................... 202111133180.7

(51) Int. Cl.
| | | |
|---|---|---|
| H01R 13/00 | (2006.01) | |
| H01R 12/71 | (2011.01) | |
| H01R 13/24 | (2006.01) | |
| H01R 13/516 | (2006.01) | |
| H01R 13/631 | (2006.01) | |
| H01R 43/16 | (2006.01) | |

(52) U.S. Cl.
CPC ....... *H01R 13/2407* (2013.01); *H01R 12/712* (2013.01); *H01R 13/516* (2013.01); *H01R 13/6315* (2013.01); *H01R 43/16* (2013.01)

(58) Field of Classification Search
CPC .............. H01R 13/2407; H01R 12/712; H01R 13/516; H01R 13/6315; H01R 43/16
See application file for complete search history.

(56) References Cited

U.S. PATENT DOCUMENTS

| | | | | |
|---|---|---|---|---|
| 7,563,120 B1* | 7/2009 | Jin | ........................ | H05K 7/1084 |
| | | | | 439/342 |
| 9,768,568 B1* | 9/2017 | Jin | ......................... | H01R 24/60 |
| 10,050,387 B1* | 8/2018 | Wu | ..................... | H01R 13/6591 |
| 2012/0178298 A1* | 7/2012 | Jin | ..................... | H01R 13/2442 |
| | | | | 439/889 |
| 2018/0309238 A1* | 10/2018 | Dai | ....................... | H01R 13/631 |

(Continued)

FOREIGN PATENT DOCUMENTS

| | | |
|---|---|---|
| CN | 203760719 U | 8/2014 |
| CN | 108847544 B | 2/2020 |

*Primary Examiner* — Phuong Chi Thi Nguyen
(74) *Attorney, Agent, or Firm* — Locke Lord LLP; Tim Tingkang Xia, Esq.

(57) ABSTRACT

An electrical connector includes an insulating body with multiple accommodating slots, and multiple terminals accommodated in the accommodating slots. Each terminal has an elastic arm, a floating contact portion and a conducting portion. The elastic arm and the floating contact portion are provided at an interval. One end of the elastic arm is connected with the floating contact portion through an insulating block. When each terminal is mated with a first electronic component and a second electronic component, the conducting portion is electrically connected to the first electronic component, the floating contact portion is electrically connected to the second electronic component, the elastic arm provides an elastic force such that the floating contact portion moves downward, and the floating contact portion and the conducting portion are directly electrically connected.

21 Claims, 24 Drawing Sheets

(56) References Cited

U.S. PATENT DOCUMENTS

2021/0075140 A1\* 3/2021 Ho ..................... H01R 13/2435
2023/0018797 A1\* 1/2023 Jin ....................... H01R 13/516
2023/0070662 A1\* 3/2023 Jin ....................... H01R 43/007
2023/0075216 A1\* 3/2023 Jin ..................... H01R 13/2435

\* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN202111037210.4 filed in China on Sep. 6, 2021, and patent application Serial No. CN202111133180.7 filed in China on Sep. 27, 2021. The disclosure of each of the above applications is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector having good high frequency characteristics.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector is used to electrically connect a chip module to a circuit board. The electrical connector has an insulating body, a plurality of accommodating slots running through the insulating body, and a plurality of terminals accommodated in the accommodating slots. Each terminal has an elastic arm, a contact portion and a conducting portion. The contact portion is located at one end of the elastic arm and is connected to the elastic arm. The electrical connector further has a conductor, and the conductor is located between the contact portion and the conducting portion. When the electrical connector is mated with the chip module and the circuit board, an upper end of the contact portion and the chip module are in contact with each other, a lower end of the conducting portion and the circuit board are in contact with each other, the contact portion is pressed to move downward to be in contact with an upper end of the conductor, and the conducting portion is pressed to move upward to be in contact with the conductor, such that signals of the chip module and the circuit board may be transmitted through the electrical connector.

However, since the contact portion is located at one end of the elastic arm and is connected to the elastic arm, when the electrical connector is mated with the chip module and the circuit board, the signals of the chip module and the signals of the circuit board will transmit to the elastic arm through the contact portion. Thus, the signals being transmitted to the elastic arm will diffuse to the surrounding, and the signals being diffused will cause signal interferences to the adjacent terminals, further affecting the high frequency characteristics of the electrical connector. Further, when the electrical connector is mated with the chip module and the circuit board, the upper end of the contact portion and the chip module are in contact with each other, the lower end of the conducting portion and the circuit board are in contact with each other, the contact portion is pressed to move downward to be in contact with an upper end of the conductor, and the conducting portion is pressed to move upward to be in contact with the conductor. Thus, the signals between the chip module and the circuit board must be transmitted to the conductor through the contact portion, and then transmitted to the conducting portion through the conductor. However, since the contact portion and the conducting portion are pressed to deviate, resulting in the contact portion not being stably in contact with the conductor, and the conducting portion not being stably in contact with the conductor. Thus, the electrical connector cannot stably transmit the signals between the chip module and the circuit board, further affecting the signal transmitting characteristics of the electrical connector.

Therefore, a heretofore unaddressed need to design an electrical connector exists in the art to address the aforementioned deficiencies and inadequacies.

SUMMARY

The present invention is directed to an electrical connector, in which an elastic arm and a floating contact portion are provided at an interval, and one end of the elastic arm is connected with the floating contact portion through an insulating block. When each terminal is mated with the first electronic component and the second electronic component, the conducting portion is electrically connected to the first electronic component, the floating contact portion is electrically connected to the second electronic component, the elastic arm provides an elastic force such that the floating contact portion moves along a vertical direction, and the floating contact portion and the conducting portion are directly electrically connected, thus preventing signals of the first electronic component and signals of the second electronic component from being transmitted to the elastic arm, and improving the high frequency characteristics, such that the signals may be stably transmitted.

To achieve the foregoing objective, the present invention adopts the following technical solutions.

An electrical connector is configured to electrically connect a first electronic component to a second electronic component. The electrical connector includes: an insulating body, provided with a plurality of accommodating slots; and a plurality of terminals accommodated in the accommodating slots, wherein each of the terminals has an elastic arm, a floating contact portion and a conducting portion, the elastic arm and the floating contact portion of at least one of the terminals are provided at an interval, and one end of the elastic arm is connected with the floating contact portion through an insulating block; wherein when each of the terminals is mated with the first electronic component and the second electronic component, the conducting portion is electrically connected to the first electronic component, the floating contact portion is electrically connected to the second electronic component, the elastic arm provides an elastic force such that the floating contact portion moves downward, and the floating contact portion and the conducting portion are directly electrically connected.

In certain embodiments, the conducting portion and the elastic arm are not electrically connected, and the conducting portion of each of the terminals is downward exposed out of a corresponding one of the accommodating slots to be soldered to the first electronic component.

In certain embodiments, along a direction perpendicular to a plate surface of each of the terminals, a lower end of the floating contact portion has a first guiding portion formed by bending, an upper end of the conducting portion is provided with a second guiding portion corresponding to the first guiding portion, and when each of the terminals is mated with the first electronic component and the second electronic component, the first guiding portion and the second guiding portion are mated with each other, such that a plate surface of the floating contact portion and a plate surface of the conducting portion are in contact with each other.

In certain embodiments, the elastic arm has a first elastic portion and a second elastic portion located at an inner side of the first elastic portion, the elastic arm has an elongated slot and a stopping portion, the elongated slot is located between the first elastic portion and the second elastic portion, an upper end of the stopping portion is connected to the first elastic portion, a lower end of the stopping portion is connected to the second elastic portion, and the stopping portion is at least partially exposed out of the insulating block.

In certain embodiments, the elastic arm has a first embedded portion, the first embedded portion is located at one side of the stopping portion adjacent to the floating contact portion, the first embedded portion is provided with a first through slot running through the first embedded portion, the stopping portion is located between the first through slot and the elongated slot, the floating contact portion has a second embedded portion corresponding to the first embedded portion, the second embedded portion is provided with a second through slot running through the second embedded portion, the insulating block is insert-molded and wraps the first embedded portion and the second embedded portion, and an insulating material of the insulating block partially passes through the first through slot and the second through slot.

In certain embodiments, when each of the terminals is mated with the first electronic component and the second electronic component, the floating contact portion moves downward and deflects along a clockwise direction, and the insulating block is located between the elastic arm and the conducting portion to separate the elastic arm and the conducting portion.

In certain embodiments, the floating contact portion has two clamping portions, the conducting portion is located between the two clamping portions, and the conducting portion is respectively in contact with the two clamping portions.

In certain embodiments, each of the terminals has a deformation arm located below the elastic arm and connected to the elastic arm, the conducting portion and the deformation arm are provided at an interval, one side of the deformation arm adjacent to the conducting portion is connected to the conducting portion through a plastic block, and when each of the terminals is mated with the first electronic component and the second electronic component, the deformation arm provides an elastic force to move upward.

In certain embodiments, for each of the terminals, a first gap exists between one side of the floating contact portion away from the elastic arm and an inner wall of a corresponding one of the accommodating slots, a second gap exists between one side of the conducting portion away from the deformation arm and the inner wall of the corresponding one of the accommodating slots, and when each of the terminals is mated with the first electronic component and the second electronic component, the floating contact portion deflects along a clockwise direction and enters the first gap, and the conducting portion deflects along a counterclockwise direction and enters the second gap.

In certain embodiments, the insulating block and the plastic block are aligned along a vertical direction, when each of the terminals is subject to a force, the insulating block and the plastic block abut each other, one end of the insulating block adjacent to the floating contact portion is configured to stop the conducting portion, and one end of the plastic block adjacent to the conducting portion is configured to stop the floating contact portion.

In certain embodiments, the floating contact portion does not pass downward beyond the insulating block, one side of the floating contact portion away from the elastic arm has a first contact surface, the conducting portion has a second contact surface corresponding to the first contact surface, the first contact surface is located between the insulating block and the second contact surface, and when each of the terminals is mated with the first electronic component and the second electronic component, the first contact surface is in contact with the second contact surface.

In certain embodiments, the conducting portion and the floating contact portion are integrally provided, each of the terminals has a first connecting portion and a second connecting portion, the second connecting portion is located below the first connecting portion and is connected to a lower end of the first connecting portion, an upper end of the first connecting portion is connected to a lower end of the floating contact portion, a lower end of the second connecting portion is connected to the conducting portion, and the first connecting portion and the second connecting portion are provided to form an angle therebetween.

In certain embodiments, each of the terminals has a fixing portion, the fixing portion is located at one end of the elastic arm away from the floating contact portion and is connected to the elastic arm, and when each of the terminals is mated with the first electronic component and the second electronic component, the first connecting portion and the second connecting portion move toward one side adjacent to the fixing portion, a gap exists between the first connecting portion and the fixing portion, and a gap exists between the second connecting portion and the fixing portion.

In certain embodiments, each of the terminals has a deformation arm, the deformation arm and the conducting portion are provided at an interval, one side of the deformation arm adjacent to the conducting portion is connected to the conducting portion through a plastic block, and along a horizontal direction, a distance from the insulating block to the first connecting portion is less than a distance from the elastic arm to the first connecting portion, and a distance from the plastic block to the second connecting portion is less than a distance from the deformation arm to the second connecting portion.

In certain embodiments, the floating contact portion has a vertical section and an oblique section bending and extending from the vertical section toward one side adjacent to the elastic arm, the insulating block is located below the oblique section, and a distance from the insulating block to the oblique section is less than a distance from the elastic arm to the oblique section.

In certain embodiments, the conducting portion and the floating contact portion are integrally provided, the conducting portion has a lower contact portion exposed downward out of a corresponding one of the accommodating slots, the lower contact portion is configured to be in contact with the first electronic component, the floating contact portion has an upper contact portion exposed upward out of the corresponding one of the accommodating slots, the upper contact portion is configured to be in contact with the second electronic component, and the lower contact portion and the upper contact portion are staggered along a horizontal direction.

In certain embodiments, the elastic arm, the floating contact portion and the conducting portion are all located on a same vertical plane, an upper end of the conducting portion is connected to a lower end of the floating contact portion, the elastic arm has a first embedded portion, the floating contact portion is provided with a second embedded portion corresponding to the first embedded portion, the first embedded portion has a first cross-sectional surface facing the second embedded portion, the second embedded portion has a second cross-sectional surface corresponding to the first cross-sectional surface, and a size of the first cross-sectional surface is equal to a size of the second cross-sectional surface.

In certain embodiments, the elastic arm has a first embedded portion provided in the insulating block, a first bending portion is provided to bend and extend downward from the first embedded portion toward one side away from the floating contact portion, a second bending portion is provided to bend and extend downward from a lower end of the first bending portion toward one side adjacent to the floating contact portion, and when each of the terminals is mated with the first electronic component and the second electronic component, the second bending portion upward abuts the insulating block.

In certain embodiments, the elastic arm has a first embedded portion, the first embedded portion is provided in the insulating block, the floating contact portion has a vertical section and a second embedded portion extending obliquely from the vertical section toward one side adjacent to the elastic arm, the second embedded portion is partially exposed out of the insulating block, such that a slit exists between the insulating block and the vertical section, and when each of the terminals is mated with the first electronic component and the second electronic component, the slit is reserved for the vertical section.

In certain embodiments, each of the terminals has a fixing portion, the second embedded portion is provided with a first bending portion and an extending portion extending obliquely from the first bending portion toward one side adjacent to the fixing portion, the insulating block wraps outside the extending portion, the insulating block is partially located between the extending portion and the vertical section, the insulating block at least partially wraps outside the first bending portion, the insulating block is partially located between the first bending portion and the vertical section, and when each of the terminals is mated with the first electronic component and the second electronic component, the extending portion is configured to stop the insulating block from moving toward one side away from the floating contact portion, and the first bending portion is configured to stop the insulating block from moving toward one side away from the floating contact portion.

In certain embodiments, the vertical section has a first vertical portion and a second vertical portion located below the first vertical portion, a width of the second vertical portion is greater than a width of the first vertical portion, the second embedded portion is provided with a first bending portion and a second bending portion, the first bending portion is located above the second bending portion, the first bending portion is connected to the first vertical portion, the first bending portion is partially exposed out of the insulating block such that the slit is located between the insulating block and the first vertical portion, the second bending portion is connected to the second vertical portion, and the second bending portion is embedded in the insulating block such that no gap exists between the insulating block and the second vertical portion.

In certain embodiments, each of the terminals has a fixing portion and an abutting arm, the fixing portion is downward exposed to a corresponding one of the accommodating slots, the abutting arm is upward exposed to the corresponding one of the accommodating slots, one of the abutting arm adjacent to the fixing portion is connected to the fixing portion, and when each of the terminals is mated with the first electronic component and the second electronic component, the fixing portion is electrically connected to the first electronic component, and the abutting arm is electrically connected to the second electronic component.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
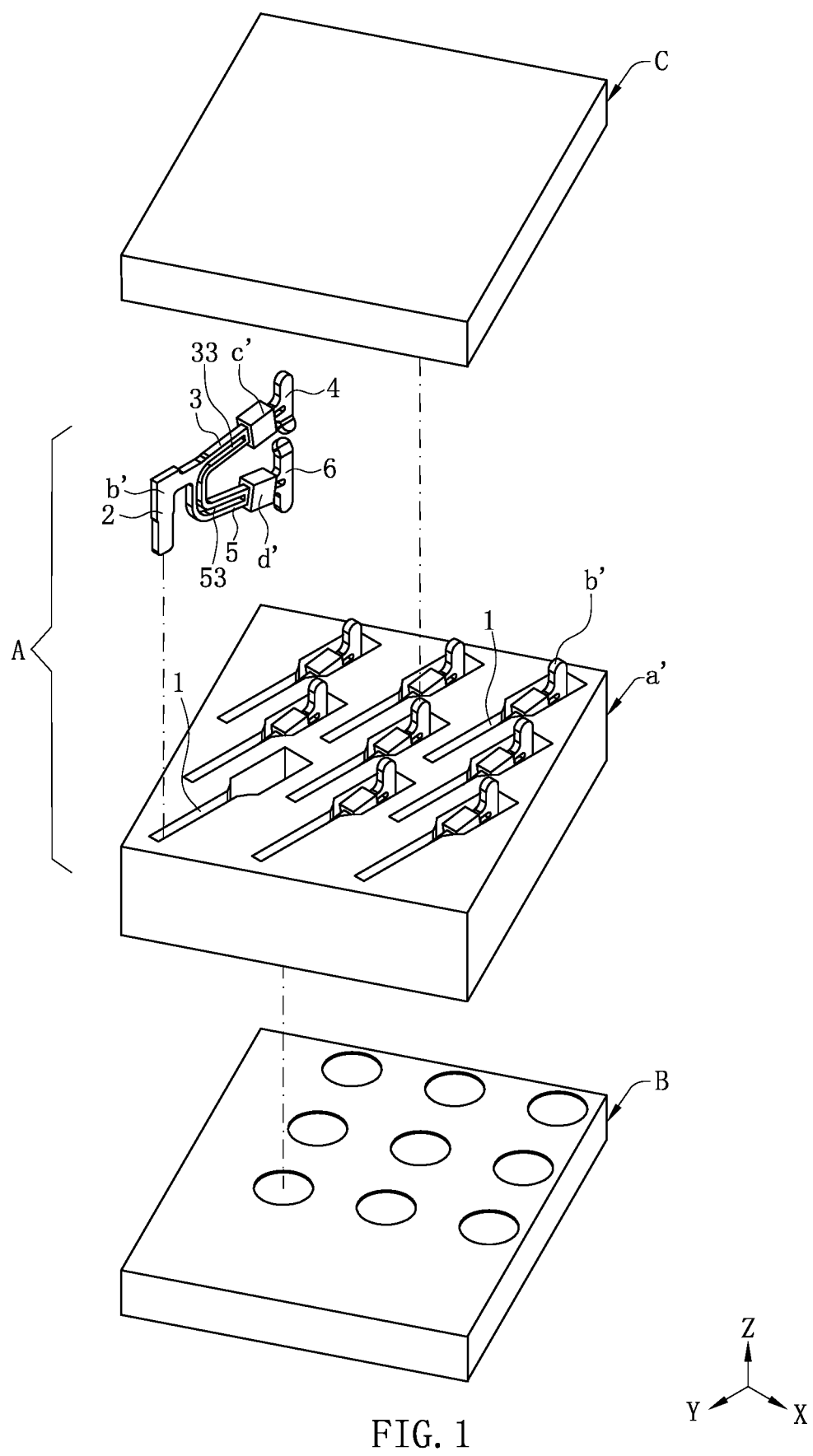
FIG. 1 is a perspective exploded view of an electrical connector according to a first embodiment of the present invention.
Figure 2:
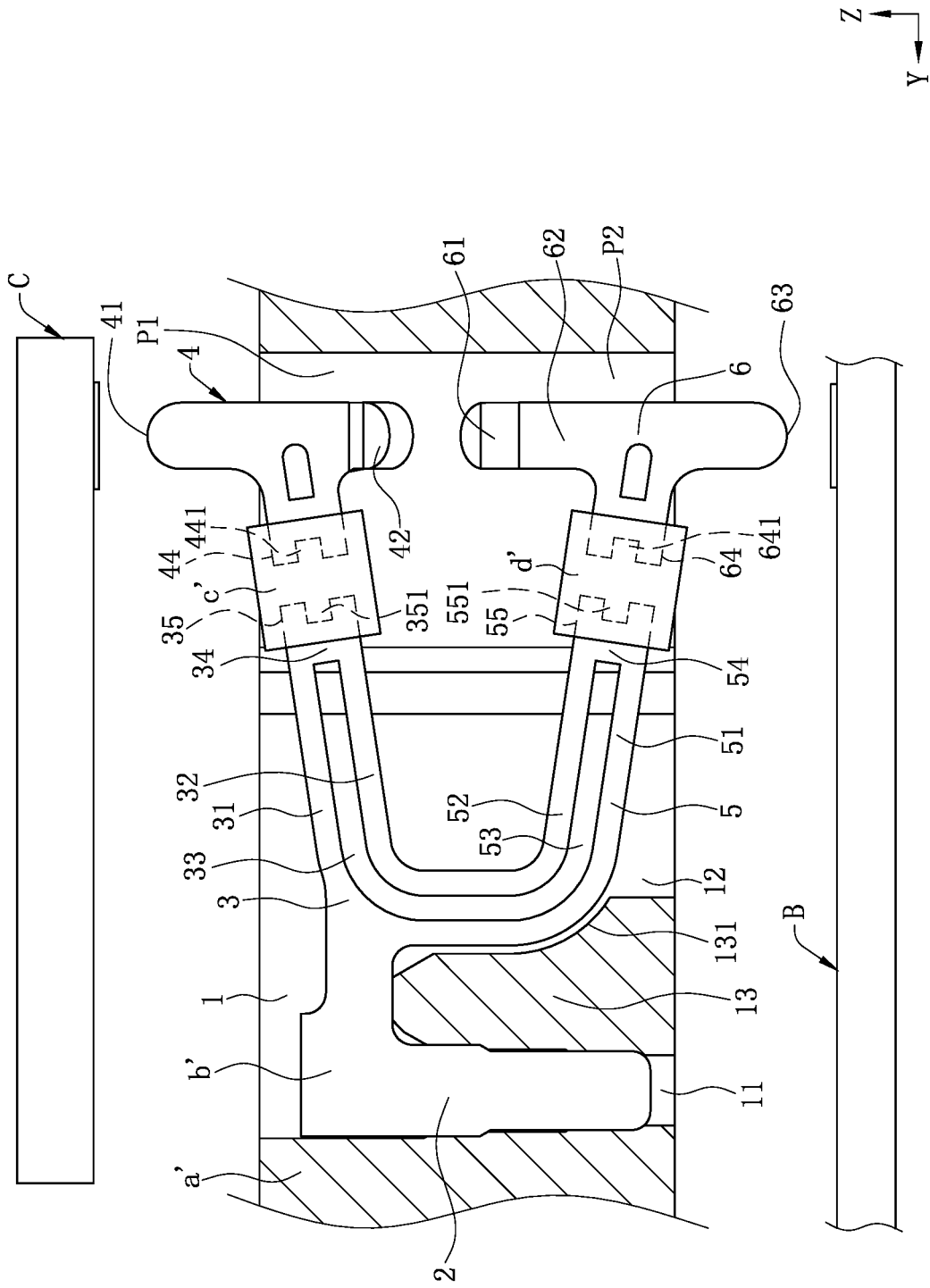
FIG. 2 is a sectional view of the electrical connector before the electrical connector is mated with the first electronic component and the second electronic component according to the first embodiment of the present invention.
Figure 3:
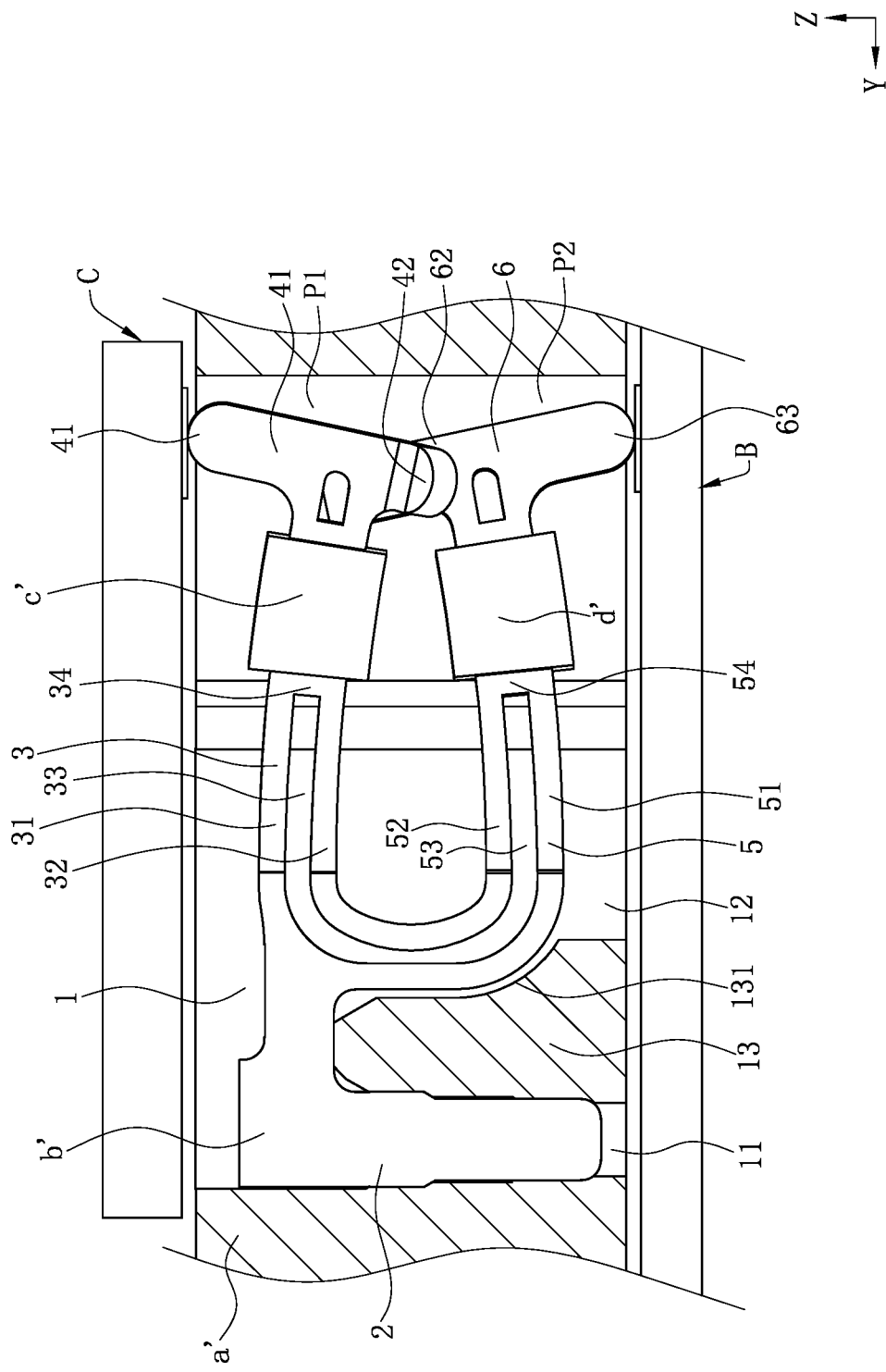
FIG. 3 is a sectional view of the electrical connector when the electrical connector is mated with the first electronic component and the second electronic component according to the first embodiment of the present invention.
Figure 4:
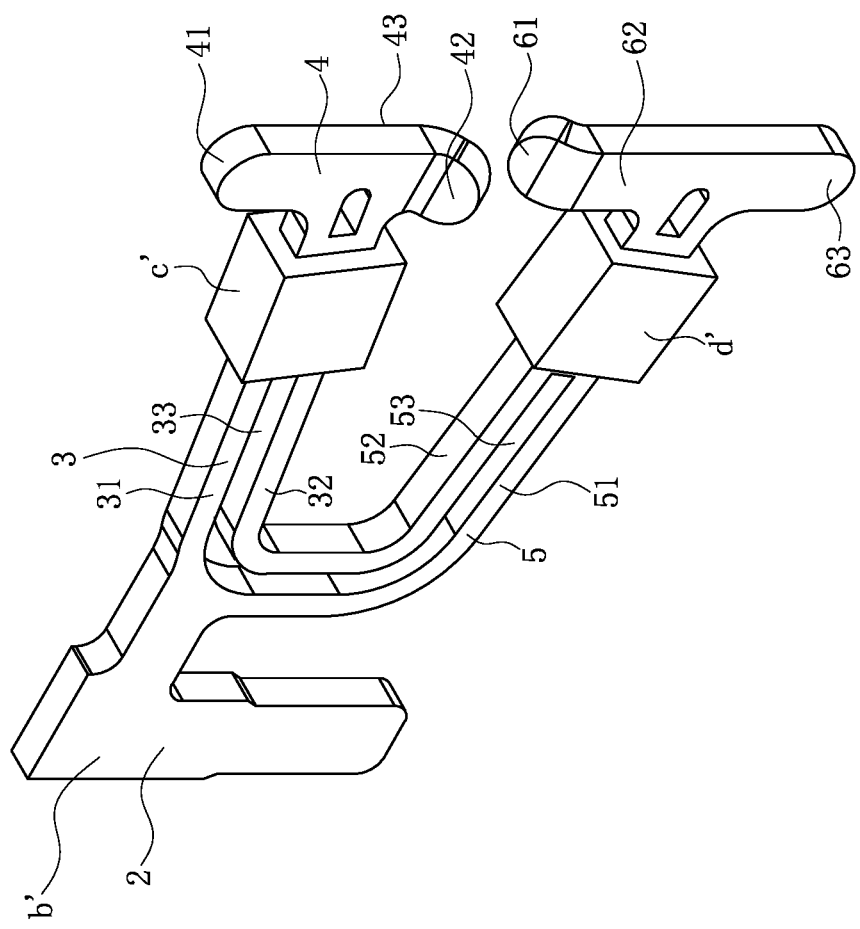
FIG. 4 is a schematic view of the terminal, the insulating block and the plastic block of the electrical connector according to the first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-24. In accordance with the purposes of this invention, as embodied and broadly described herein, this invention, in one aspect, relates to an electrical connector.

As shown in FIG. 1 to FIG. 24, the electrical connector A according to certain embodiments of the present invention defines a front-rear direction and a left-right direction and an up-down direction (a vertical direction) perpendicularly to the front-rear direction. For convenience of understanding of the accompanying drawings, the forward direction in the front-rear direction is a positive direction of the X-axis, the leftward direction in the left-right direction is a positive direction of the Y-axis, and the upward direction in the vertical direction is a positive direction of the Z-axis.

FIG. 1 to FIG. 4 show a first embodiment of the present invention.

As shown in FIG. 1 to FIG. 4, in this embodiment, the electrical connector A is electrically connected downward to a first electronic component B (in this embodiment, the first electronic component B is a circuit board), and is electrically connected upward to a second electronic component C (in this embodiment, the second electronic component C is a chip module). The electrical connector A includes an insulating body a', and a plurality of accommodating slots 1 run vertically through the insulating body a'. A plurality of terminals b' one-to-one correspond to the accommodating slots 1, and each terminal b' is accommodated in a corresponding accommodating slot 1. Each terminal b' has a fixing portion 2, an elastic arm 3, a floating contact portion 4, a deformation arm 5 and a conducting portion 6. The fixing portion 2 and an inner wall surface of the corresponding accommodating slot 1 are matched with each other, such that the terminal b' is retained in the corresponding accommodating slot 1. The conducting portion 6 is downward exposed in the corresponding accommodating slot 1 to be electrically connected to the first electronic component B, and the floating contact portion 4 is upward exposed in the corresponding accommodating slot 1 to be electrically connected to the second electronic component C. The elastic arm 3 and the floating contact portion 4 are provided at an interval, and one end of the elastic arm 3 adjacent to the floating contact portion 4 is connected with the floating contact portion 4 through an insulating block c'. The deformation arm 5 and the conducting portion 6 are provided at an interval, and one end of the deformation arm 5 adjacent to the conducting portion 6 is connected to the conducting portion 6 through a plastic block d'.

As shown in FIG. 1 to FIG. 4, the insulating body a' is in a rectangular shape. Each accommodating slot 1 has a fixing cavity 11 and a receiving cavity 12 in communication with each other. A positioning post 13 is located between the fixing cavity 11 and the receiving cavity 12. An upper surface of the positioning post 13 is lower than an upper surface of the insulating body a', and a lower surface of the positioning post 13 is flush with a lower surface of the insulating body a' (in other embodiments, the lower surface of the positioning post 13 may be not flush with the lower surface of the insulating body a'). The positioning post 13 is further provided with a curve-shaped supporting portion 131 corresponding to the deformation arm 5, and the curve-shaped supporting portion 131 is used to support the deformation arm 5. The fixing cavity 11 runs vertically through the insulating body a'. A portion of each terminal b' is inserted into the fixing cavity 11, and the terminal b' interferes with the inner wall of the fixing cavity 11 and the positioning post 13, such that the terminal b' is stably fixed in the accommodating slot 1. The receiving cavity 12 runs vertically through the insulating body a'. Another portion of the terminal b' is accommodated in the receiving cavity 12, and a gap exists between the terminal b' and an inner wall surface of the receiving cavity 12. The insulating block c' and the plastic block d' are also accommodated in the receiving cavity 12. A gap exists between the insulating cavity c' and the receiving cavity 12, and a gap exists between the plastic cavity d' and the receiving cavity 12.

As shown in FIG. 1 to FIG. 4, the fixing portion 2, the elastic arm 3, the floating contact portion 4, the deformation arm 5 and the conducting portion 6 of each terminal b' are all located on a same vertical plane. The elastic arm 3 is located above the deformation arm 5. One end of the elastic arm 3 adjacent to the fixing portion 2 is connected to the fixing portion 2, and one end of the deformation arm 5 adjacent to the fixing portion 2 is connected to the elastic arm 3.

As shown in FIG. 1 to FIG. 4, the floating contact portion 4 is located above the conducting portion 6, and one side of the floating contact portion 4 adjacent to the elastic arm 3 is indirectly connected to the elastic arm 3 through the insulating block c'. That is, the floating contact portion 4 and the elastic arm 3 are not directly connected. In other words, the floating contact portion 4 and the elastic arm 3 are separated and are not electrically connected, and are connected through the insulating block c'. One side of the conducting portion 6 adjacent to the deformation arm 5 is indirectly connected to the deformation arm 5 through the plastic block d'. That is, the conducting portion 6 and the deformation arm 5 are not directly connected. In other words, the conducting portion 6 and the deformation arm 5 are separated and are not electrically connected, and are connected through the plastic block d'.

As shown in FIG. 1 to FIG. 4, the fixing portion 2 is inserted into the fixing cavity 11 downward from top thereof, and the fixing portion 2 and the positioning post 13 interfere with the inner wall of the fixing cavity 11, such that the terminal b' may be stably fixed in the accommodating slot 1 through the fixing portion 2.

As shown in FIG. 1 to FIG. 4, the elastic arm 3 is connected to the floating contact portion 4 through the insulating block c'. Thus, the elastic arm 3 may provide an elastic force such that the floating contact portion 4 moves vertically. The elastic arm 3 has a first elastic portion 31 and a second elastic portion 32 located at an inner side of the first elastic portion 31. The elastic arm 3 further has an elongated slot 33, and the elongated slot 33 is located between the first elastic portion 31 and the second elastic portion 32, such that the first elastic portion 31 or the second elastic portion 32 may elastically deform relative to the second elastic portion 32 or the first elastic portion 31, such that the elastic arm 3 has good elasticity.

As shown in FIG. 1 to FIG. 4, the elastic arm 3 further has a stopping portion 34. The stopping portion 34 is located closer to the floating contact portion 4 than the elongated slot 33. An upper end of the stopping portion 34 is connected to the first elastic portion 31, and a lower end of the stopping portion 34 is connected to the second elastic portion 32. The elastic arm 3 further has a first embedded portion 35, and the first embedded portion 35 is located at one side of the stopping portion 34 adjacent to the floating contact portion 4. The first embedded portion 35 has a first through slot 351 (and in other embodiments, there may be two or three first through slots 351), and the first through slot 351 runs through the first embedded portion 35. The stopping portion 34 is located between the first through slot 351 and the elongated slot 33. That is, the elongated slot 33 and the first through slot 351 are separated by the stopping portion 34. Thus, when the insulating block c' is insert-molded, the insulating block c' wraps outside the first embedded portion 35 and a portion of the stopping portion 34 (and in other embodiments, it is possible that the whole stopping portion 34 is embedded in the insulating block c'). A portion of the insulating material passes through the first through slot 351, such that there is a strong bonding force between the insulating block c' and the elastic arm 3. The stopping portion 34 is partially embedded in the insulating block c'. Thus, the stopping portion 34 may stop the liquid insulating material from flowing into the elongated slot 33, further preventing the insulating block c' from deforming during forming thereof.

As shown in FIG. 1 to FIG. 4, a first gap P1 exists between one side of the floating contact portion 4 away from the elastic arm 3 and the inner wall surface of the accommodating slot 1, such that the floating contact portion 4 may deflect along a clockwise direction after being pressed and protrude into the first gap P1. The floating contact portion 4 has an upper contact portion 41, and the upper contact portion 41 is exposed upward to the accommodating slot 1 to be in contact with the second electronic component C.

As shown in FIG. 1 to FIG. 4, a lower end of the floating contact portion 4 has a first guiding portion 42. The first guiding portion 42 is formed by bending. The floating contact portion 4 further has a first contact surface 43. The first contact surface 43 is located above the first guiding portion 42 to be in contact with the conducting portion 6. The first guiding portion 42 is used to be mated with the conducting portion 6, such that the first contact surface 43 of the floating contact portion 4 may be in contact with the conducting portion 6.

As shown in FIG. 1 to FIG. 4, the floating contact portion 4 further has a second embedded portion 44. The second embedded portion 44 corresponds to the first embedded portion 35, and the second embedded portion 44 is embedded in the insulating block c'. The second embedded portion 44 is provided with a second through slot 441 running through the second embedded portion 44 (and in other embodiments, there may be two or three second through slots 441). A portion of the insulating material passes through the second through slot 441, such that there is a strong bonding force between the insulating block c' and the floating contact portion 4.

As shown in FIG. 1 to FIG. 4, one end of the deformation arm 5 adjacent to the fixing portion 2 bends and extends upward to be connected to the elastic arm 3, and the bending location of the end of the deformation arm 5 adjacent to the fixing portion 2 bending upward is located above the curve-shaped supporting portion 131. The bending radian of the bending location corresponds to the bending radian of the curve-shaped supporting portion 131. One end of the deformation arm 5 away from the fixing portion 2 is connected to the conducting portion 6 through the plastic block d', such that the deformation arm 5 may provide an elastic force for the conducting portion 6, such that the conducting portion 6 may move vertically.

As shown in FIG. 1 to FIG. 4, the deformation arm 5 further has a third elastic portion 51 and a fourth elastic portion 52 located at an inner side of the third elastic portion 51. An upper end of the third elastic portion 51 is connected to a lower end of the first elastic portion 31, and an upper end of the fourth elastic portion 52 is connected to a lower end of the second elastic portion 32. The widths of the first elastic portion 31, the second elastic portion 32, the third elastic portion 51 and the fourth elastic portion 52 are substantially equal, and the thicknesses of the first elastic portion 31, the second elastic portion 32, the third elastic portion 51 and the fourth elastic portion 52 are substantially equal. The deformation arm 5 further has a connecting slot 53. The connecting slot 53 is located between the third elastic portion 51 and the fourth elastic portion 52, and an upper end of the connecting slot 53 is in communication with the elongated slot 33. The connecting slot 53 and the elongated slot 33 have similar functions. That is, the connecting slot 53 allows the third elastic portion 51 to deform relative to the fourth elastic portion 52 or the fourth elastic portion 52 to deform relative to the third elastic portion 51, further enhancing the elasticity of the deformation arm 5.

As shown in FIG. 1 to FIG. 4, the deformation arm 5 further has a stop portion 54. An upper end of the stop portion 54 is connected to the fourth elastic portion 52, and a lower end of the stop portion 54 is connected to the third elastic portion 51. The deformation arm 5 further has a third embedded portion 55, and the third embedded portion 55 has a third through slot 551 runs through the third embedded portion 55 (and in other embodiments, there may be two or three third through slots 551). The stop portion 54 is located between the connecting slot 53 and the third through slot 551 to separate the connecting slot 53 and the third through slot 551. The plastic block d' is insert-molded and wraps the third embedded portion 55 and a portion of the stop portion 54 (and in other embodiments, it is possible that the whole stop portion 54 is embedded in the plastic block d'). A portion of the plastic material passes through the third through slot 551, thereby enhancing the bonding force between the plastic block d' and the third embedded portion 55. The stop portion 54 and the stopping portion 34 have similar functions. The stop portion 54 is used to stop the liquid plastic material, thus preventing the plastic material from flowing into the connecting slot 53.

As shown in FIG. 1 to FIG. 4, a second gap P2 exists between one side of the conducting portion 6 away from the deformation arm 5 and the inner wall surface of the accommodating slot 1, such that the conducting portion 6 may deflect along a counter-clockwise direction after being pressed and protrude into the second gap P2. The conducting portion 6 and the deformation arm 5 are provided at an interval. That is, the deformation arm 5 and the conducting portion 6 are not electrically connected, and the conducting portion 6 and the deformation arm 5 are indirectly connected by the plastic block d' (in other embodiments, the conducting portion 6 and the deformation arm 5 may be directly connected. That is, the deformation arm 5 and the conducting portion 6 are electrically connected, and there is no need to provide the plastic block d' between the conducting portion 6 and the deformation arm 5).

As shown in FIG. 1 to FIG. 4, an upper end of the conducting portion 6 is provided with a second guiding portion 61 corresponding to the first guiding portion 42. The second guiding portion 61 is formed by bending, and the bending direction of the second guiding portion 61 is opposite to the bending direction of the first guiding portion 42. The conducting portion 6 is further provided with a second contact surface 62 corresponding to the first contact surface 43. The second contact surface 62 is located below the second guiding portion 61 to be in contact with the first contact surface 43. When the terminal b' is mated with the first electronic component B and the second electronic component C, the second guiding portion 61 and the first guiding portion 42 are mated with each other, such that the first contact surface 43 and the second contact surface 62 are in direct contact with each other. That is, the plate surface of the floating contact portion 4 and the plate surface of the conducting portion 6 are in contact with each other.

As shown in FIG. 1 to FIG. 4, a lower end of the conducting portion 6 has a lower contact portion 63. The lower contact portion 63 is exposed downward out of the accommodating slot 1 to be in contact with the first electronic component B. One side of the conducting portion 6 adjacent to the deformation arm 5 further has a fourth embedded portion 64 extending. The fourth embedded portion 64 is provided with a fourth through slot 641 running through the fourth embedded portion 64 (and in other embodiments, there may be two or three fourth through slots 641). The plastic block d' is insert-molded and wraps outside the fourth embedded portion 64, and a portion of the plastic material passes through the fourth through slot 641, thus enhancing the bonding force between the plastic block d' and the conducting portion 6.

As shown in FIG. 1 to FIG. 4, when the terminal b' is mated with the first electronic component B and the second electronic component C, the lower contact portion 63 is downward mated with the first electronic component B, and the upper contact portion 41 is upward mated with the second electronic component C. The elastic arm 3 is given a force to generate an elastic deformation, and transmits the elastic force to the floating contact portion 4 through the insulating block c', such that the floating contact portion 4 moves downward and deflects along the clockwise direction and protrudes into the first gap P1. The deformation arm 5 is given a force to generate an elastic deformation, and transmits the elastic force to the conducting portion 6 through the plastic block d', such that the conducting portion 6 moves upward and deflects along the counter-clockwise direction and protrudes into the second gap P2. With the floating contact portion 4 continuously moving downward and the conducting portion 6 continuously moving upward, the first guiding portion 42 and the second guiding portion 61 are mated together, such that the plate surface of the floating contact portion 4 and the plate surface of the conducting portion 6 are in direct contact with each other. That is, the first contact surface 43 and the second contact surface 62 are in direct contact, such that the floating contact portion 4 and the conducting portion 6 are directly electrically connected, and the signals of the first electronic component B and the signals the second electronic component C are exchanged between each other through the floating contact portion 4 and the conducting portion 6 that are directly electrically connected. In other embodiments, it is also possible that prior to the terminal b' being mated with the first electronic component B and the second electronic component C, the floating contact portion 4 is electrically connected to the conducting portion 6.

As shown in FIG. 1 to FIG. 4, in the process of the terminal b' being mated with the first electronic component B and the second electronic component C, even if the floating contact portion 4 is given a force to deflect, the floating contact portion 4 does not pass beyond the plastic block d' to be in contact with the deformation arm 5. That is, the plastic block d' is always located between the deformation arm 5 and the floating contact portion 4 to separate the deformation arm 5 and the floating contact portion 4. Similarly, even if the conducting portion 6 is given a force to deflect, the conducting portion 6 does not pass beyond the insulating block c' to be in contact with the elastic arm 3. That is, the insulating block c' is always located between the elastic arm 3 and the conducting portion 6 to separate the elastic arm 3 and the conducting portion 6.

As shown in FIG. 1 to FIG. 4, the insulating block c' and the plastic block d' are aligned along the vertical direction. Thus, even when the floating contact portion 4 and the conducting portion 6 are pressed excessively, along the vertical direction, the insulating block c' will firstly abut the plastic block d', one end of the insulating block c' adjacent to the floating contact portion 4 is used to stop the conducting portion 6, and one end of the plastic block d' adjacent to the conducting portion 6 is used to stop the floating contact portion 4, further preventing from the case where the insulating block c' and the plastic block d' are staggered, resulting in the conducting portion 6 and the elastic arm 3 are in contact with each other, and the floating contact portion 4 and the deformation arm 5 are in contact with each other.

Figure 5:
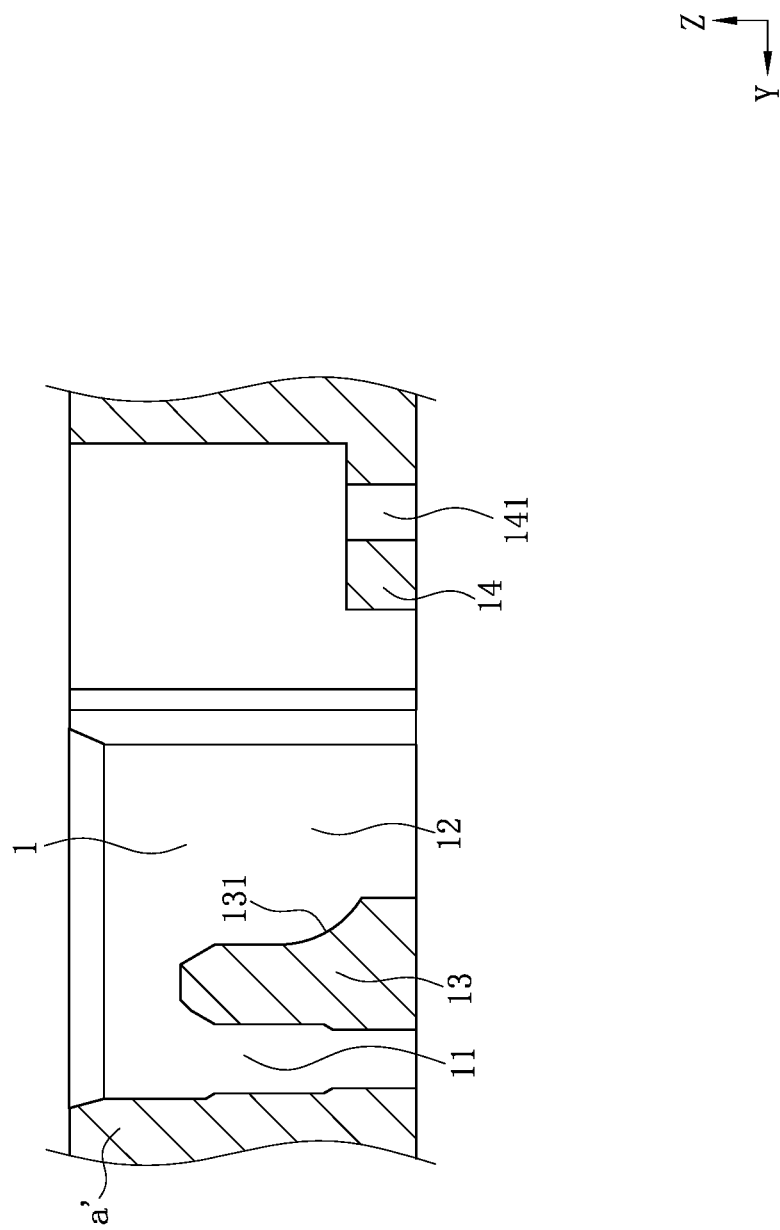
FIG. 5 is a sectional view of the insulating body of an electrical connector according to a second embodiment of the present invention.
Figure 6:
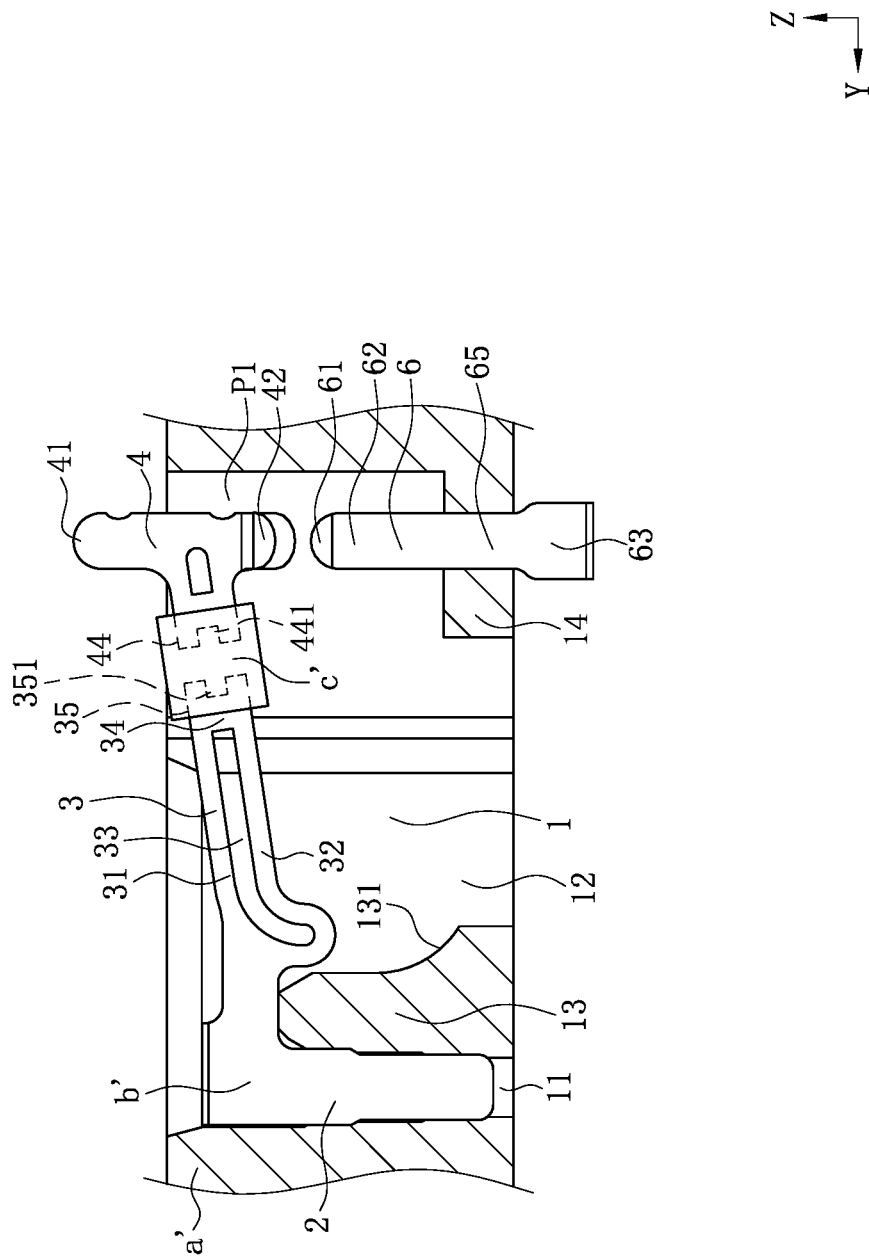
FIG. 6 is a sectional view of the electrical connector before the electrical connector is mated with the first electronic component and the second electronic component according to the second embodiment of the present invention.
Figure 7:
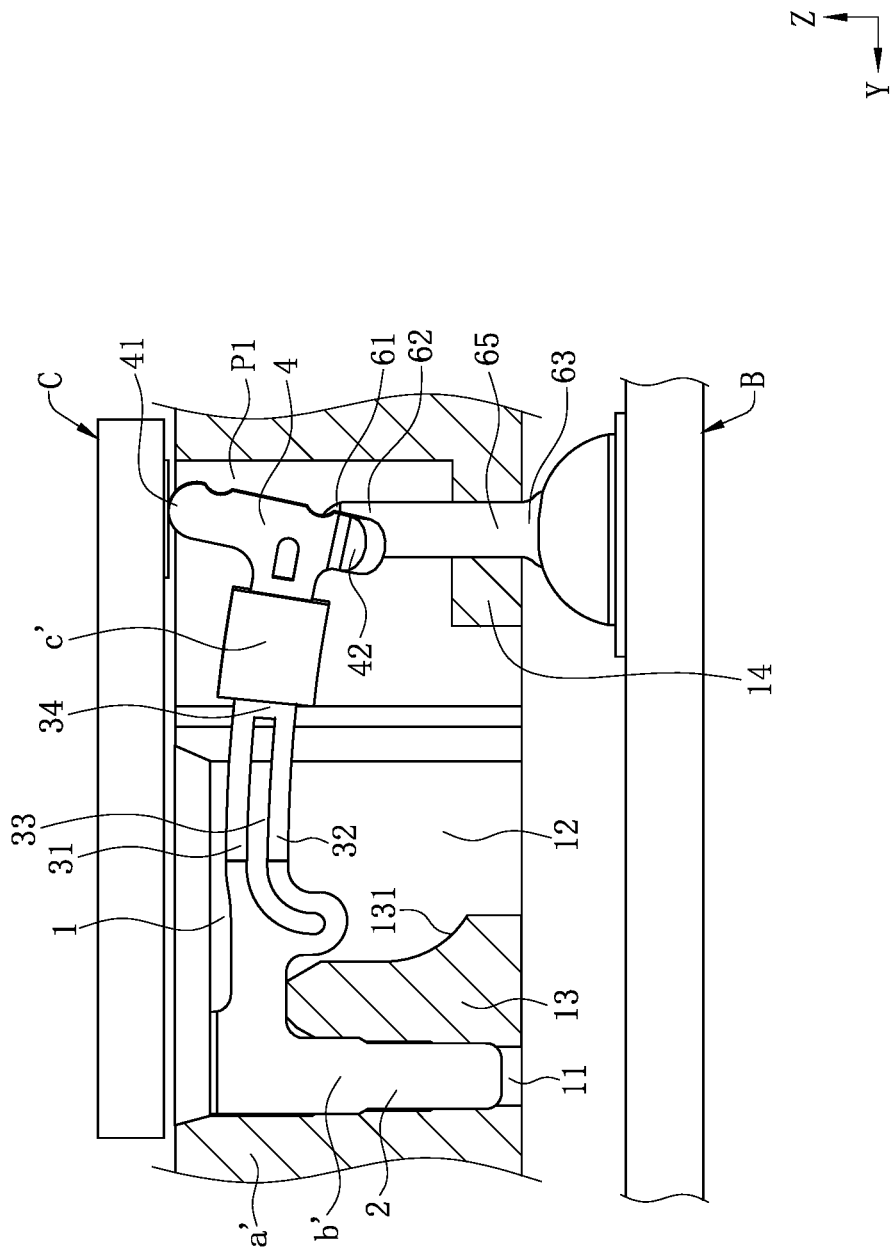
FIG. 7 is a sectional view of the electrical connector when the electrical connector is mated with the first electronic component and the second electronic component according to the second embodiment of the present invention.

FIG. 5 to FIG. 7 show an electrical connector A according to a second embodiment, which is different from the electrical connector A according to the first embodiment in that, with the remaining structures and connection relationships being identical to those of the first embodiment: each receiving cavity 12 is provided with a retaining portion 14, and the retaining portion 14 is formed by extending from the inner wall surface at one side of the receiving cavity 12 away from the fixing cavity 11 toward one side thereof adjacent to the fixing cavity 11. A lower surface of the retaining portion 14 is flush with a lower surface of the insulating body a', and an upper surface of the retaining portion 14 is lower than an upper surface of the insulating body a'. The retaining portion 14 is provided with a retaining hole 141, and the retaining hole 141 runs vertically through the retaining portion 14.

As shown in FIG. 5 to FIG. 7, each terminal b' has one fixing portion 2, one elastic arm 3, one floating contact portion 4 and one conducting portion 6, and is not provided with the deformation arm 5. The fixing portion 2 is retained in the fixing cavity 11. The elastic arm 3 is connected to the floating contact portion 4 through the insulating block c'. The conducting portion 6 is not electrically connected to the elastic arm 3, and the conducting portion 6 is retained in the retaining hole 141. The conducting portion 6 has the second contact surface 62 and a positioning portion 65 located below the second contact surface 62 and connected to the second contact surface 62. The lower contact portion 63 is located below the positioning portion 65 and is connected to the positioning portion 65. An upper end of the second contact surface 62 is connected to the second guiding portion 61, and the second guiding portion 61 and the second contact surface 62 are both exposed upward to the retaining hole 141. The second guiding portion 61 is an oblique surface, and the oblique surface is formed upward from bottom thereof and extends obliquely backward from a front plate surface of the conducting portion 6 (and in other embodiments, the oblique surface may be formed upward from bottom thereof and extends obliquely forward from a rear plate surface of the conducting portion 6). The lower contact portion 63 is downward exposed to the retaining hole 141, and is soldered to the first electronic component B.

Figure 8:
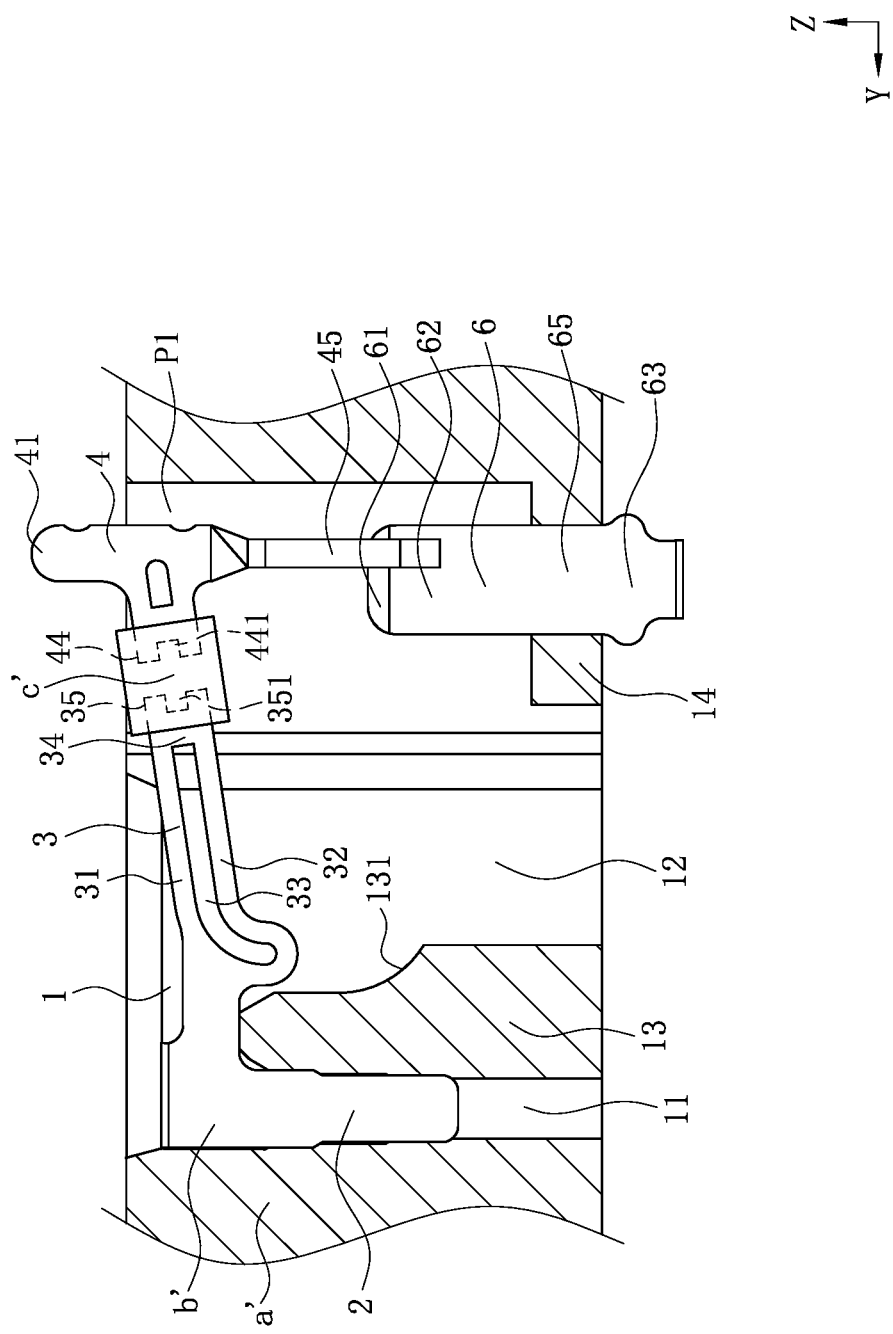
FIG. 8 is a sectional view of the electrical connector before the electrical connector is mated with the first electronic component and the second electronic component according to a third embodiment of the present invention.
Figure 9:
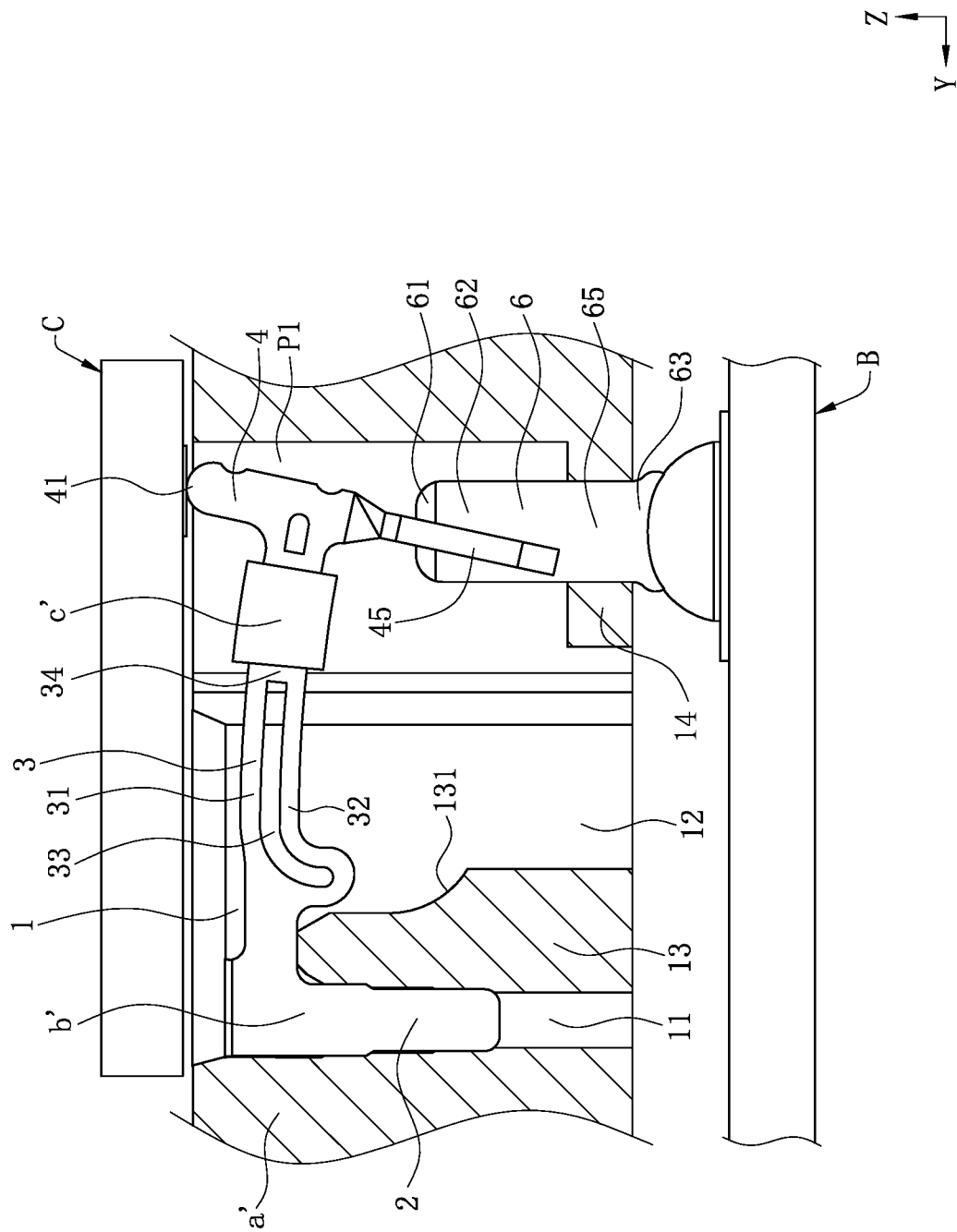
FIG. 9 is a sectional view of the electrical connector when the electrical connector is mated with the first electronic component and the second electronic component according to the third embodiment of the present invention.
Figure 10:
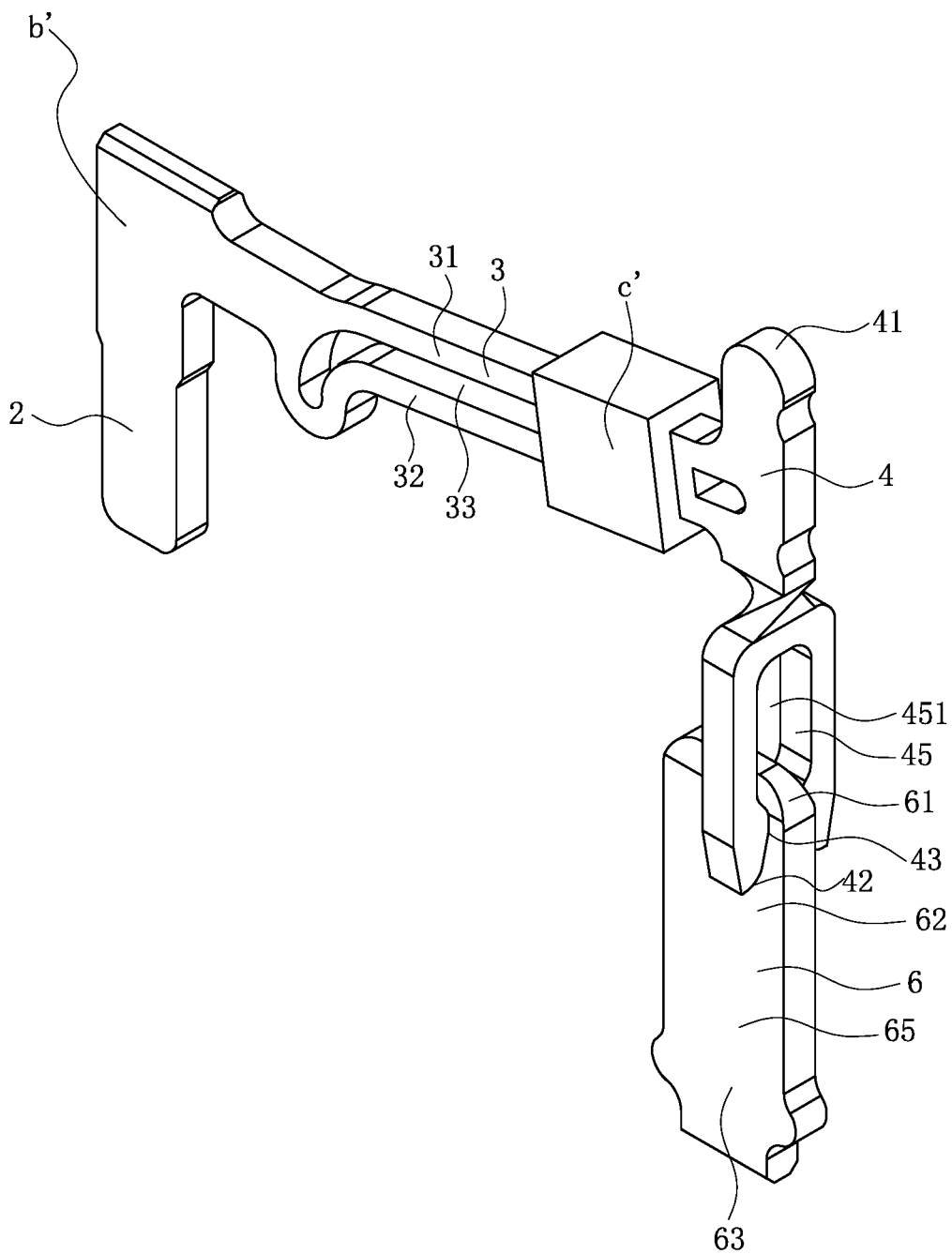
FIG. 10 is a schematic view of the terminal and the insulating block of the electrical connector according to the third embodiment of the present invention.

FIG. 8 to FIG. 10 show an electrical connector A according to a third embodiment, which is different from the electrical connector A according to the second embodiment in that, with the remaining structures and connection relationships being identical to those of the second embodiment: a lower end of the floating contact portion 4 has two clamping portions 45, and an opening 451 exists between the two clamping portions 45. The opening 451 runs downward through the lower end of the floating contact portion 4. Each clamping portion 45 is provided with one first guiding portion 42, and the first guiding portion 42 is an oblique surface. The two first guiding portions 42 are provided opposite to each other, and the opening 451 is located between the two first guiding portions 42. The conducting portion 6 has two second guiding portions 61, and each of the two second guiding portions 61 is an oblique surface. The two oblique surfaces are respectively located on the two plate surfaces of the conducting portion 6. The two first guiding portions 42 and the two second guiding portions 61 are mated with each other to guide the conducting portion 6 to be inserted into the opening 451.

As shown in FIG. 8 to FIG. 10, before the terminal b' is mated with the first electronic component B and the second electronic component C, that is, before the elastic arm 3 is pressed, the two first guiding portions 42 and the two second guiding portions 61 are mated to each other, such that the conducting portion 6 is located between the two clamping portions 45 and protrudes into the opening 451, and the two plate surfaces of the conducting portion 5 are respectively in contact with the two clamping portions 45. That is, the two second contact surfaces 62 of the conducting portion 6 are in contact with the two first contact surfaces 43 of the floating contact portion 4. When the terminal b' is mated with the first electronic component B and the second electronic component C, the elastic arm 3 is pressed, such that the floating contact portion 4 further moves downward, and the contact between the floating contact portion 4 and the conducting portion 6 is more stable (and in other embodiments, it is possible that before the terminal b' is mated with the first electronic component B and the second electronic component C, the floating contact portion 4 and the conducting portion 6 are provided at an interval. That is, the floating contact portion 4 and the conducting portion 6 are not in contact and not electrically connected. When the terminal b' is mated with the first electronic component B and the second electronic component C, the elastic arm 3 is pressed, and the floating contact portion 4 moves downward, such that the two first guiding portions 42 and the two second guiding portions 61 are mated with each other, the conducting portion 6 is located between the two clamping portions 45 and protrudes into the opening 451, and the two plate surfaces of the conducting portion 5 are respectively in contact with the two clamping portions 45. That is, the two second contact surfaces 62 of the conducting portion 6 are in contact with the two first contact surfaces 43 of the floating contact portion 4).

Figure 11:
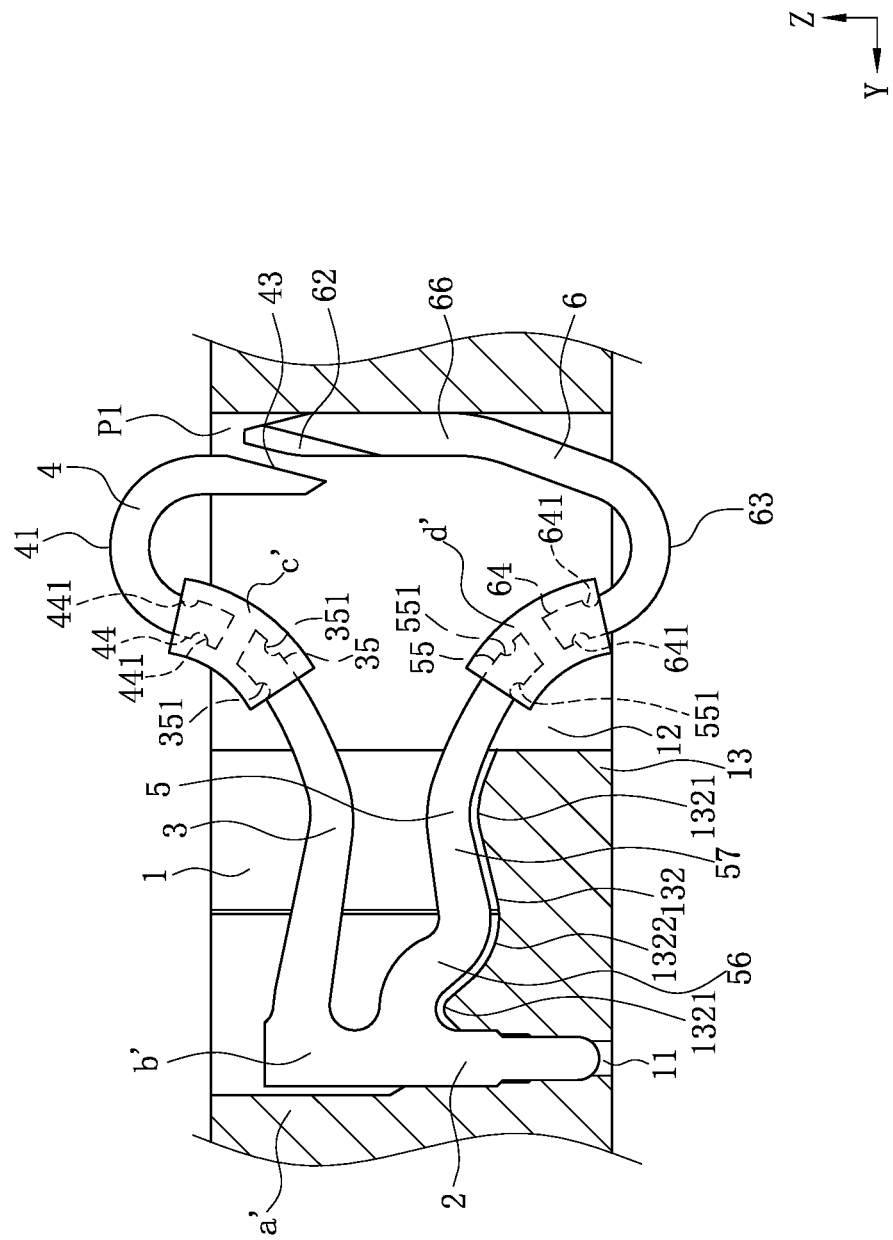
FIG. 11 is a sectional view of the electrical connector before the electrical connector is mated with the first electronic component and the second electronic component according to a fourth embodiment of the present invention.
Figure 12:
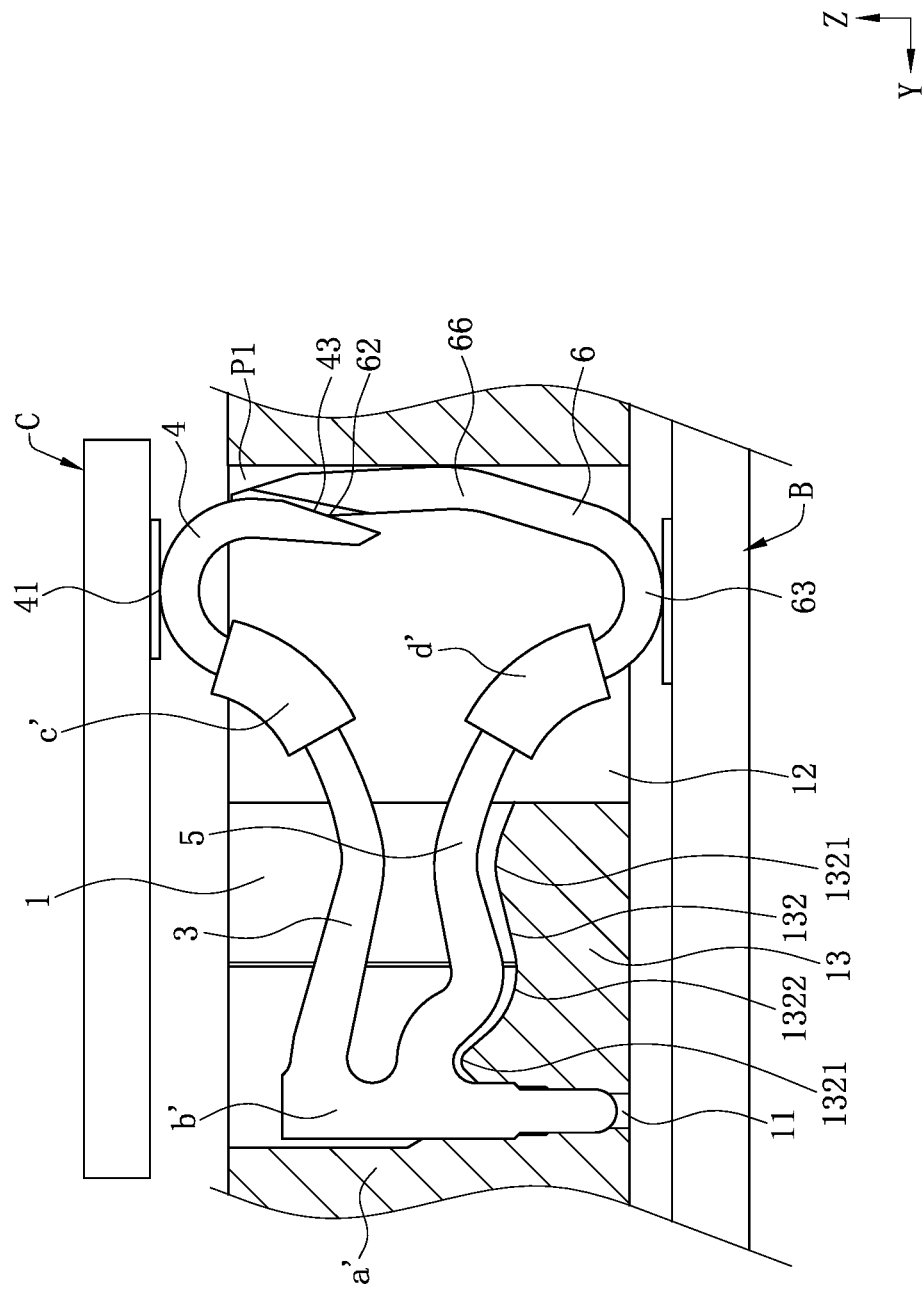
FIG. 12 is a sectional view of the electrical connector when the electrical connector is mated with the first electronic component and the second electronic component according to the fourth embodiment of the present invention.

FIG. 11 to FIG. 12 show an electrical connector A according to a fourth embodiment, which is different from the electrical connector A according to the first embodiment in that, with the remaining structures and connection relationships being identical to those of the first embodiment: the positioning post 13 is provided with a curved surface supporting portion 132 corresponding to the deformation arm 5. The curved surface supporting portion 132 has two protrusion portions 1321 and a recess portion 1322 located between the two protrusion portions 1321. Thus, the curved surface supporting portion 132 may support the deformation arm 5, and may limit the deformation arm 5 from deflecting excessively along the left-right direction.

As shown in FIG. 11 to FIG. 12, the elastic arm 3 is not provided with the elongated slot 33 and the stopping portion 34. That is, the elastic arm 3 is single-beam type. The elastic arm 3 is not provided with the first elastic portion 31 and the second elastic portion 32 that may relatively deform. One side of the elastic arm 3 adjacent to the floating contact portion 4 is provided with the first embedded portion 35, and the first embedded portion 35 is provided with two first through slots 351, such that portions of the insulating material pass through the two first through slots 351, further enhancing the bonding force between the elastic arm 3 and the insulating block c'.

As shown in FIG. 11 to FIG. 12, the first gap P1 exists between one side of the floating contact portion 4 away from the elastic arm 3 and the inner wall surface of the accommodating slot 1, and the first gap P1 is reserved for the conducting portion 6. The lower end of the floating contact portion 4 does not pass downward beyond the insulating block c'. The insulating block c' is used to separate the elastic arm 3 and the floating contact portion 4, thus preventing the floating contact portion 4 from being in contact with the elastic arm 3 after being pressed.

As shown in FIG. 11 to FIG. 12, one side of the floating contact portion 4 adjacent to the elastic arm 3 is provided with the second embedded portion 44. The second embedded portion 44 is provided with two second through slots 441, and portions of the insulating material pass through the two second through slots 441, such that there is a strong bonding force between the insulating block c' and the floating contact portion 4. The upper contact portion 41 extends obliquely upward from the second embedded portion 44 and bends downward, and the upper contact portion 41 is used to be in contact with the second electronic component C. The floating contact portion 4 is not provided with the first guiding portion 42. However, one side of the lower end of the floating contact portion 4 away from the elastic arm 3 has the first contact surface 43, and the first contact surface 43 extends obliquely upward and toward one side away from the elastic arm 3 from the lower end of the floating contact portion 4.

As shown in FIG. 11 to FIG. 12, one end of the deformation arm 5 adjacent to the fixing portion 2 is directly connected to the fixing portion 2, and the deformation arm 5 is not provided with the connecting slot 53 and the stop portion 54. That is, the deformation arm 5 is single-beam type. The deformation arm 5 is not provided with the third elastic portion 51 and the fourth elastic portion 52 that may relatively deform. The deformation arm 5 is further provided with a first bending section 56. The first bending section 56 is formed by bending downward from one end of the deformation arm 5 adjacent to the fixing portion 2, such that one end of the first bending section 56 adjacent to the fixing portion 2 is located above one of the two protrusion portions 1321 that is adjacent to the fixing portion 2, and one end of the first bending section 56 away from the fixing portion 2 protrudes into the recess portion 1322. The deformation arm 5 is further provided with a second bending section 57. The second bending section 57 is located at one side of the first bending section 56 away from the fixing portion 2, and is connected to the first bending section 56. The second bending section 57 is formed by bending upward and extending from the first bending section 56. One end of the second bending section 57 adjacent to the fixing portion 2 protrudes into the recess portion 1322, and one end of the second bending section 57 away from the fixing portion 2 is located above one of the two protrusion portions 1321 that is away from the fixing portion 2. One end of the deformation arm 5 away from the fixing portion 2 is further provided with the third embedded portion 55. The third embedded portion 55 is provided with two third through slots 551, and portions of the plastic material pass through the two third through slots 551, thus enhancing the bonding force between the plastic block d' and the third embedded portion 55.

As shown in FIG. 11 to FIG. 12, one side of the conducting portion 6 adjacent to the deformation arm 5 is provided with the fourth embedded portion 64. The fourth embedded portion 64 is provided with two fourth through slots 641, and portions of the plastic material pass through the two fourth through slots 641, thus enhancing the bonding force between the plastic block d' and the conducting portion 6. The lower contact portion 63 bends downward and extends from one side of the fourth embedded portion 64 toward one side away from the fixing portion 2, and the lower contact portion 63 is used to abut the first electronic component B.

As shown in FIG. 11 to FIG. 12, a conduction portion 66 bends upward and extends from one end of the lower contact portion 63 away from the fixing portion 2. One side of the conduction portion 66 away from the fixing portion 2 abuts the inner wall surface of the receiving cavity 12, and an upper end of the conduction portion 66 protrudes into the first gap P1. The conduction portion 66 is not provided with the second guiding portion 61. However, one side of the upper end of the conduction portion 66 adjacent to the fixing portion 2 is provided with the second contact surface 62. The second contact surface 62 corresponds to the first contact surface 43, and the second contact surface 62 is formed by extending obliquely downward and toward one side adjacent to the fixing portion 2 from a top end of the conduction portion 66. The first contact surface 43 is located between the insulating block c' and the second contact surface 62, thus preventing the second contact surface 62 from being pressed and in contact with the elastic arm 3.

As shown in FIG. 11 to FIG. 12, when the terminal b' is mated with the first electronic component B and the second electronic component C, the floating contact portion 4 is pressed and moves downward, such that one side the first contact surface 43 away from the fixing portion 2 enters the first gap P1 to be in contact with the second contact surface 62. The first electronic component B and the second electronic component C may perform signal transmission through the direct contact between the floating contact portion 4 and the conducting portion 6.

Figure 13:
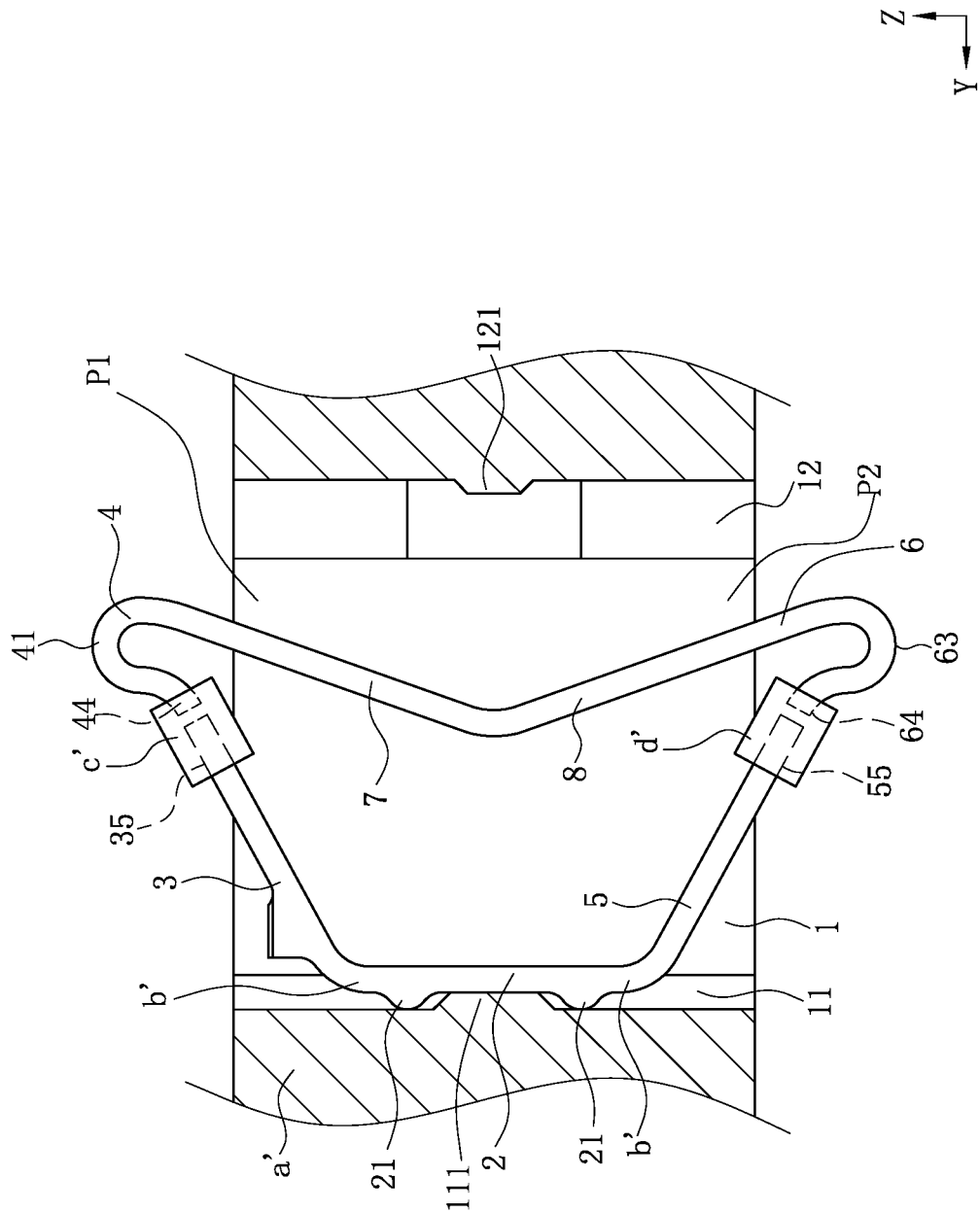
FIG. 13 is a sectional view of the electrical connector before the electrical connector is mated with the first electronic component and the second electronic component according to a fifth embodiment of the present invention.
Figure 14:
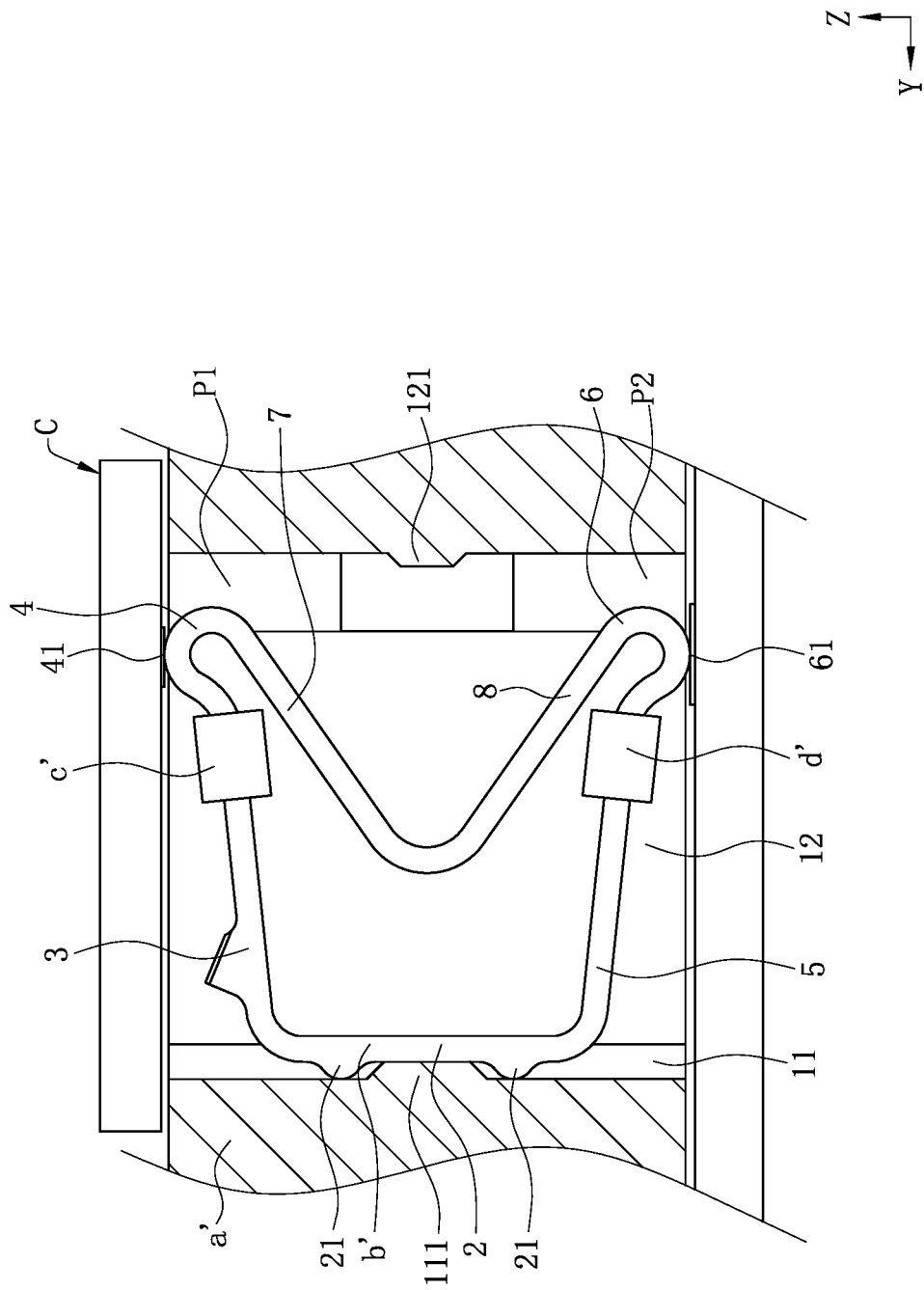
FIG. 14 is a sectional view of the electrical connector when the electrical connector is mated with the first electronic component and the second electronic component according to the fifth embodiment of the present invention.
Figure 15:
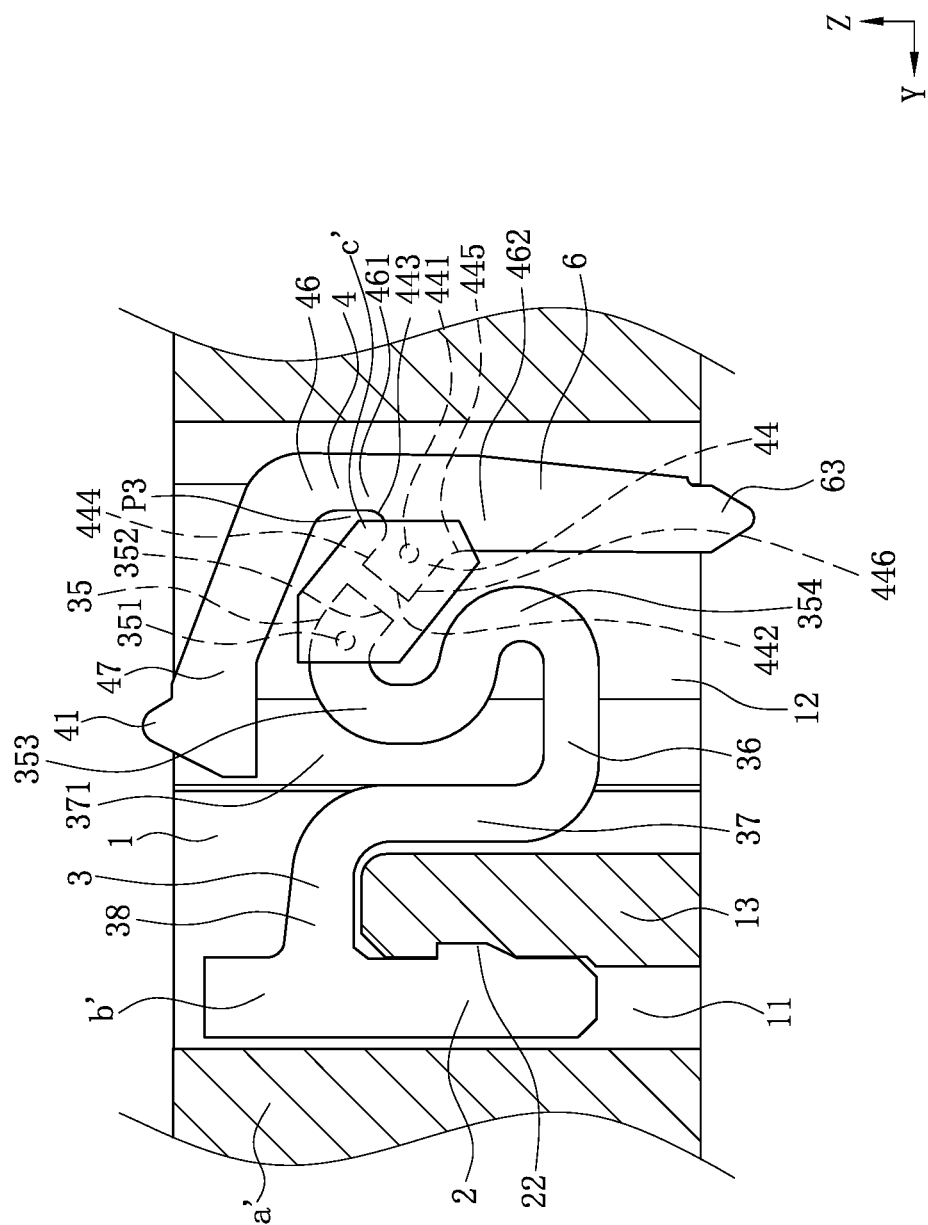
FIG. 15 is a sectional view of the electrical connector before the electrical connector is mated with the first electronic component and the second electronic component according to a sixth embodiment of the present invention.
Figure 16:
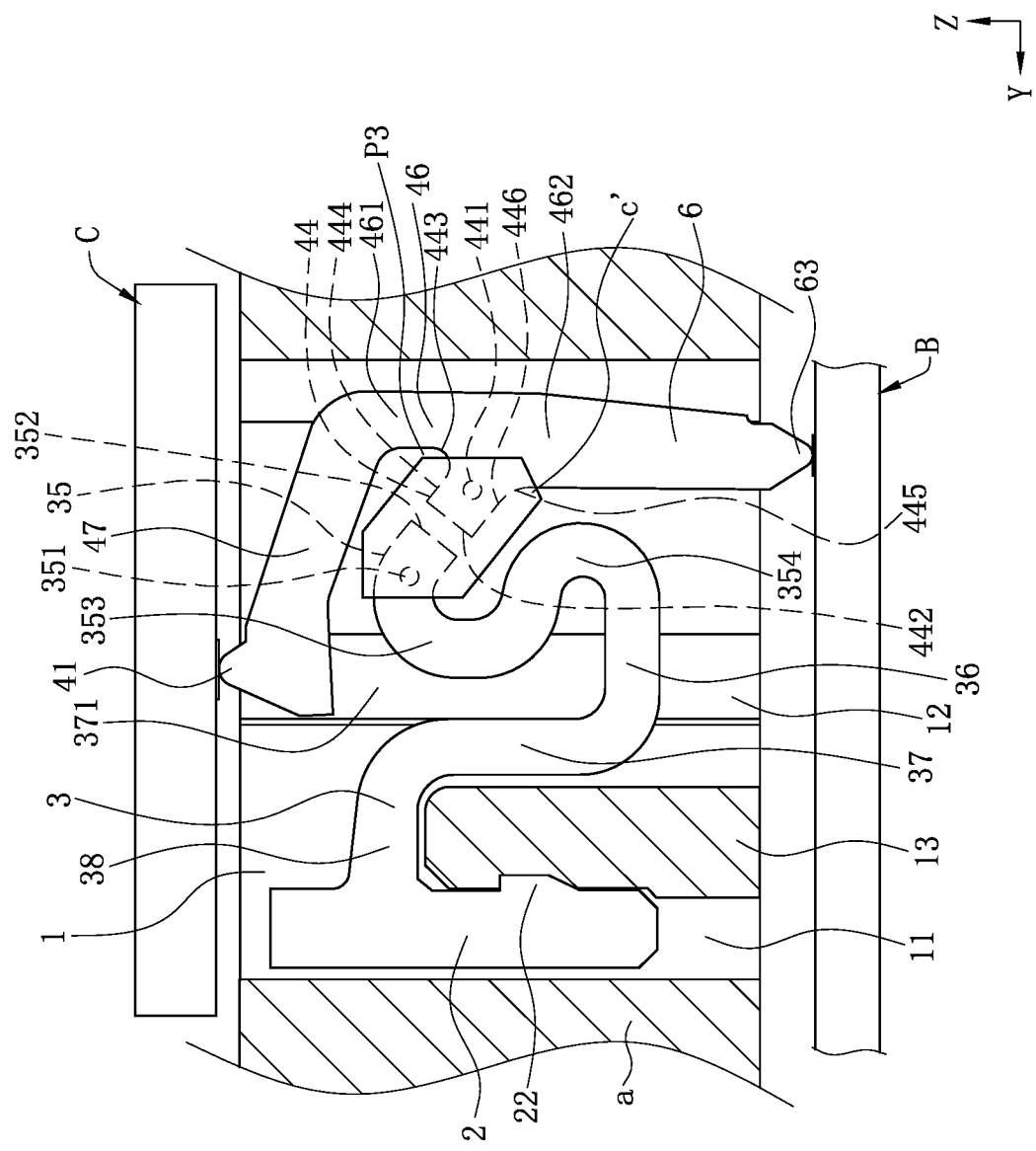
FIG. 16 is a sectional view of the electrical connector when the electrical connector is mated with the first electronic component and the second electronic component according to the sixth embodiment of the present invention.
Figure 17:
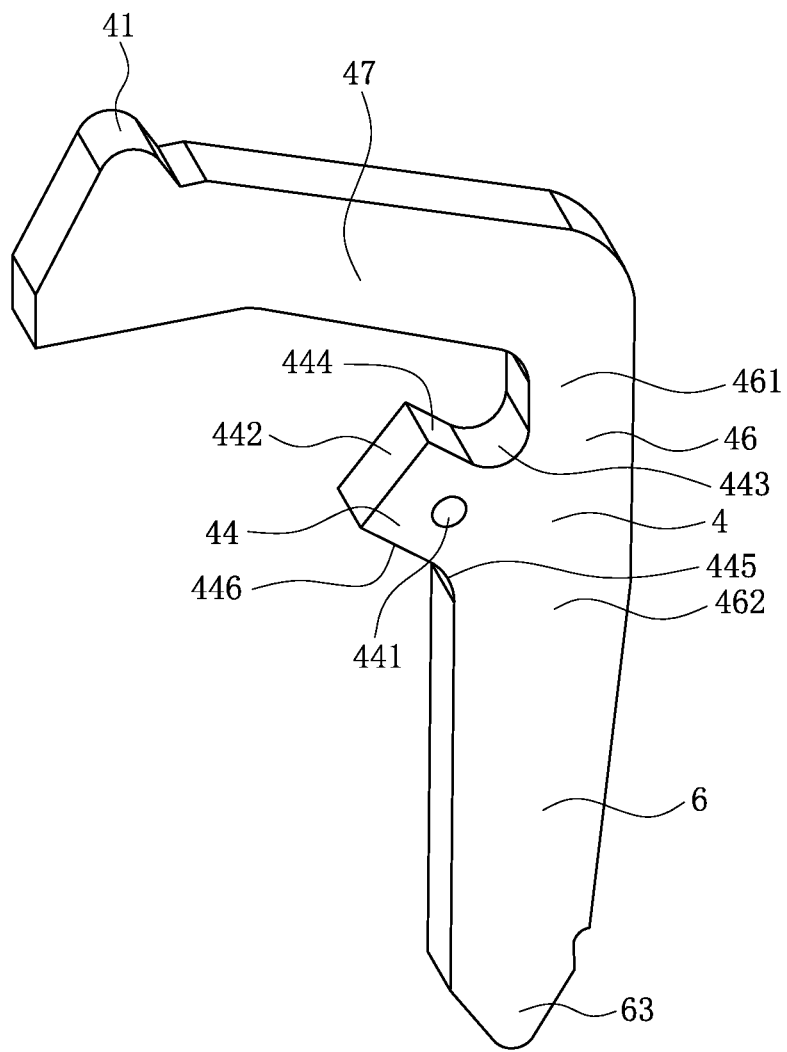
FIG. 17 is a schematic view of the floating contact portion and the conducting portion of the terminal according to the sixth embodiment of the present invention.
Figure 18:
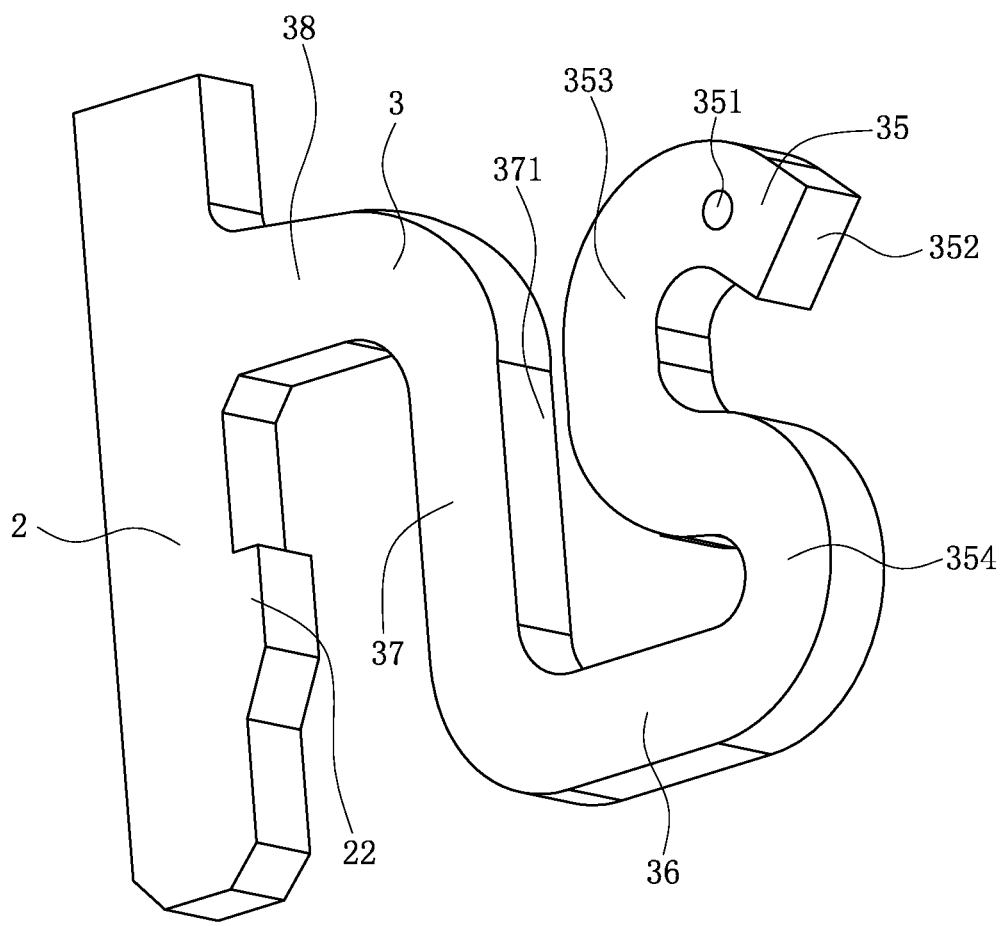
FIG. 18 is a schematic view of the fixing portion and the elastic arm of the terminal according to the sixth embodiment of the present invention.
Figure 18:
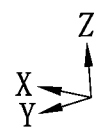

FIG. 13 to FIG. 14 show an electrical connector A according to a fifth embodiment, which is different from the electrical connector A according to the fourth embodiment in that, with the remaining structures and connection relationships being identical to those of the fourth embodiment: each accommodating slot 1 of the insulating body a' has the fixing cavity 11 and the receiving cavity 12 in communication with each other. However, the accommodating slot 1 is not provided with the positioning post 13. The inner wall of the fixing cavity 11 away from the receiving cavity 12 is protrudingly provided with a position limiting portion 111 toward one side adjacent to the receiving cavity 12, and the position limiting portion 111 is used to limit the terminal b' from moving vertically. The inner wall surface of the receiving cavity 12 away from the fixing cavity 11 is protrudingly provided with a separating portion 121 toward one side adjacent to the fixing cavity 11, and the separating portion 121 is used to prevent the terminal from being excessively pressed and damaged.

As shown in FIG. 13 to FIG. 14, along the vertical direction, the fixing portion 2 of the terminal b' is located between the elastic arm 3 and the deformation arm 5. An upper end of the fixing portion 2 is connected to the elastic arm 3, and a lower end of the fixing portion 2 is connected to the deformation arm 5. One side of the fixing portion 2 adjacent to the position limiting portion 111 is protrudingly provided with two protruding portions 21, and the two protruding portions 21 are provided at an interval along the vertical direction. The position limiting portion 111 is provided between the two protruding portions 21. Thus, an upper end of the position limiting portion 111 may stop the protruding portion 21 located above from moving downward, and a lower end of the position limiting portion 111 may stop the protruding portion 21 located below from moving upward, further limiting the terminal b' from moving vertically.

As shown in FIG. 13 to FIG. 14, one end of the elastic arm 3 adjacent to the floating contact portion 4 is provided with the first embedded portion 35, and the first embedded portion 35 is not provided with the first through slot 351. The insulating block c' is insert-molded and wraps the first embedded portion 35. One end of the deformation arm 5 adjacent to the conducting portion 6 is further provided with the third embedded portion 55, and the third embedded portion 55 is not provided with the third through slot 551. The plastic block d' is insert-molded and wraps the third embedded portion 55.

As shown in FIG. 13 to FIG. 14, each terminal b' further has a first connecting portion 7 and a second connecting portion 8, and the floating contact portion 4, the first connecting portion 7, the second connecting portion 8 and the conducting portion 6 are integrally provided. The first connecting portion 7 is located above the second connecting portion 8, and the first connecting portion 7 is connected to the second connecting portion 8. The first connecting portion 7 and the second connecting portion 8 are located between the floating contact portion 4 and the conducting portion 6. An upper end of the first connecting portion 7 is connected to the lower end of the floating contact portion 4, and a lower end of the second connecting portion 8 is connected to the upper end of the conducting portion 6. The first connecting portion 7 and the second connecting portion 8 are provided to form an angle therebetween, thus providing elastic forces to the floating contact portion 4 and the conducting portion 6, such that the floating contact portion 4 and the conducting portion 6 may move vertically.

As shown in FIG. 13 to FIG. 14, the first gap P1 exists between one side of the floating contact portion 4 away from the elastic arm 3 and the inner wall surface of the accommodating slot 1, such that the floating contact portion 4 moves downward and protrudes into the first gap P1 after being pressed. One end of the floating contact portion 4 adjacent to the elastic arm 3 is provided with the second embedded portion 44, and the second embedded portion 44 is not provided with the second through slot 441. The insulating block c' is insert-molded and wraps the second embedded portion 44. The upper contact portion 41 extends obliquely upward from the second embedded portion 44 and bends downward, and the upper contact portion 41 is used to be in contact with the second electronic component C.

As shown in FIG. 13 to FIG. 14, one end of the floating contact portion 4 away from the elastic arm 3 is connected to the first connecting portion 7. Along a downward direction from top thereof, the first connecting portion 7 extends obliquely downward and toward one side adjacent to the fixing portion 2. Along the horizontal direction, a distance from the insulating block c' to the first connecting portion 7 is less than a distance from the elastic arm 3 to the first connecting portion 7. That is, when the terminal b' is pressed, the first connecting portion 7 abuts the insulating block c' and is not in contact with the elastic arm 3.

As shown in FIG. 13 to FIG. 14, the second gap P2 exists between one side of the conducting portion 6 away from the deformation arm 5 and the inner wall surface of the accommodating slot 1, such that the conducting portion 6 moves upward and protrudes into the second gap P2 after being pressed. One end of the conducting portion 6 adjacent to the deformation arm 5 is provided with the fourth embedded portion 64, and the fourth embedded portion 64 is not provided with the fourth through slot 641. The plastic block d' is insert-molded and wraps the fourth embedded portion 64. The lower contact portion 63 extends obliquely downward from the fourth embedded portion 64 and bends upward, and the lower contact portion 63 is used to be in contact with the first electronic component B.

As shown in FIG. 13 to FIG. 14, one end of the conducting portion 6 away from the deformation arm 5 is connected to the second connecting portion 8. Along an upward direction from bottom thereof, the second connecting portion 8 extends obliquely upward and toward one side adjacent to the fixing portion 2. Along the horizontal direction, a distance from the plastic block d' to the second connecting portion 8 is less than a distance from the deformation arm 5 to the second connecting portion 8. That is, when the terminal b' is pressed, the second connecting portion 8 abuts the plastic block d' and is not in contact with the deformation arm 5.

As shown in FIG. 13 to FIG. 14, when the terminal b' is mated with the first electronic component B and the second electronic component C, the upper contact portion 41 is in upward contact with the second electronic component C, and the floating contact portion 4 is pressed to move and protrude into the first gap P1. The lower contact portion 63 is in downward contact with the first electronic component B, and the conducting portion 6 is pressed to move and protrude into the second gap P2. The angle between the first connecting portion 7 and the second connecting portion 8 gradually becomes smaller, and the first connecting portion 7 becomes gradually closer to the fixing portion 2, but there is always a gap between the first connecting portion 7 and the fixing portion 2, thus preventing the first connecting portion 7 and the fixing portion 2 from being in contact with each other. The second connecting portion 8 also becomes gradually closer to the fixing portion 2, but there is always a gap between the second connecting portion 8 and the fixing portion 2, thus preventing the second connecting portion 8 and the fixing portion 2 from being in contact with each other. The separating portion 121 is located between the floating contact portion 4 and the conducting portion 6. When the terminal b' is pressed, the floating contact portion 4 and an upper end of the separating portion 121 abut each other, and the conducting portion 6 and a lower end of the separating portion 121 abut each other, further preventing the terminal b' from being pressed and continuously deform to be damaged.

FIG. 15 to FIG. 18 show an electrical connector A according to a sixth embodiment, which is different from the electrical connector A according to the first embodiment in that, with the remaining structures and connection relationships being identical to those of the first embodiment: the positioning post 13 is a cuboid, and the positioning post 13 is not provided with the curve-shaped supporting portion 131. Each terminal b' is provided with only one fixing portion 2, one elastic arm 3, one floating contact portion 4 and one conducting portion 6, and is not provided with the deformation arm 5. The elastic arm 3 is not provided with the elongated slot 33 and the stopping portion 34. That is, the elastic arm 3 is single-beam type. A lower end of the floating contact portion 4 is connected to an upper end of the conducting portion 6.

As shown in FIG. 15 to FIG. 18, the fixing portion 2 is inserted into the fixing cavity 11 downward from top thereof, and one side of the fixing portion 2 adjacent to the positioning post 13 is protrudingly provided with a protruding barb 22 (and in other embodiments, there may be two or three protruding barbs 22). The protruding barb 22 interferes with the positioning post 13, such that the terminal b' is stably fixed in the accommodating slot 1 through the fixing portion 2.

As shown in FIG. 15 to FIG. 18, one side of the first embedded portion 35 of the elastic arm 3 adjacent to the floating contact portion 4 is further provided with a first cross-sectional surface 352. A first bending portion 353 bends downward and extends from the first embedded portion 35 toward one side away from the floating contact portion 4, and the insulating block c' passes upward beyond the first bending portion 353 along the vertical direction. A second bending portion 354 bends downward and extends from a lower end of the first bending portion 353 toward one side adjacent to the floating contact portion 4, and a distance from the second bending portion 354 to the insulating block c' is less than a distance from the second bending portion 354 to the floating contact portion 4, and a distance from the second bending portion 354 to the insulating block c' is less than a distance from the second bending portion 354 to the conducting portion 6. Along the vertical direction, the first bending portion 353 and the second bending portion 354 are connected to each other and are S-shape. Thus, when the terminal b' is mated with the first electronic component B and the second electronic component C, the first bending portion 353 and the second bending portion 354 are pressed and may deform in the horizontal direction and the vertical direction, the floating contact portion 4 is given a force to move downward and abut the insulating block c', and the second bending portion 354 is given a force to move upward and toward one side adjacent to the floating contact portion 4 and abut the insulating block c', thus preventing the floating contact portion 4 from being pressed and abutting the first bending portion 353, and preventing the floating contact portion 4 from being pressed and abutting the second bending portion 354.

As shown in FIG. 15 to FIG. 18, a first lateral portion 36 extends from a lower end of the second bending portion 354 toward one side away from the floating contact portion 4. The first lateral portion 36 is located in the receiving cavity 12, and a lower surface of the first lateral portion 36 is higher than a lower surface of the insulating body a'. Thus, the first lateral portion 36 may move in the vertical direction to provide elasticity for the terminal b' in the vertical direction. A bridging portion 37 bends upward and extends from the first lateral portion 36. The bridging portion 37 is closer to the floating contact portion 4 than the positioning post 13, and a gap exists between one side of the bridging portion 37 adjacent to the positioning post 13 and the positioning post 13, such that the bridging portion 37 may move in the horizontal direction to provide elasticity for the terminal b' in the horizontal direction. Along the horizontal direction, a reserved space 371 is further provided between the first bending portion 353 and the bridging portion 37, and the reserved space 371 is used to be reserved for the floating contact portion 4. An upper end of the bridging portion 37 is flush with an upper end of the positioning post 13 (and in other embodiments, the upper end of the bridging portion 37 may be higher than the upper end of the positioning post 13). A second lateral portion 38 is formed by bending and extending from the upper end of the bridging portion 37 toward one side away from the floating contact portion 4. The second lateral portion 38 is located above the positioning post 13, and a gap exists between the second lateral portion 38 and the positioning post 13 along the vertical direction. Thus, the second lateral portion 38 may move in the vertical direction to provide elasticity for the terminal b' in the vertical direction. One end of the second lateral portion 38 away from the floating contact portion 4 is used to be connected to the fixing portion 2.

As shown in FIG. 15 to FIG. 18, the floating contact portion 4 and the conducting portion 6 are integrally provided, and the floating contact portion 4 has a vertical section 46 and an oblique section 47 bending and extending from an upper end of the vertical section 46 toward one side adjacent to the elastic arm 3. The vertical section 46 has a first vertical portion 461 and a second vertical portion 462 located below the first vertical portion 461 and connected to a lower end of the first vertical portion 461. An upper end of the first vertical portion 461 is connected to the oblique section 47, and a lower end of the second vertical portion 462 is connected to the conducting portion 6. A width of the first vertical portion 461 is less than a width of the second vertical portion 462. That is, the width of the second vertical portion 462 is greater than the width of the first vertical portion 461 along the left-right direction.

As shown in FIG. 15 to FIG. 18, the oblique section 47 is located right above the insulating block c', the first embedded portion 35, the first bending portion 353 and the second bending portion 354. Along the vertical direction, a distance from the insulating block c' to the oblique section 47 is less than a distance from the first bending portion 353 to the oblique section 47. Thus, when the terminal b' is mated with the first electronic component B and the second electronic component C, the oblique section 47 is pressed and firstly abuts the insulating block c', thus preventing the oblique section 47 from abutting the first bending portion 353. An upper end of the oblique section 47 further has the upper contact portion 41, and the upper contact portion 41 is located right above the reserved space 371. When the terminal b' is mated with the first electronic component B and the second electronic component C, the upper contact portion 41 moves downward and protrudes into the reserved space 371, thus preventing the upper contact portion 41 from being pressed and conductively connected to the elastic arm 3.

As shown in FIG. 15 to FIG. 18, the floating contact portion 4 further has the second embedded portion 44, and the second embedded portion 44 is formed by extending obliquely from the vertical section 46 toward one side adjacent to the fixing portion 2. The second embedded portion 44 is located below the oblique section 47, and an angle between the second embedded portion 44 and the vertical section 46 is an acute angle (and in other embodiments, the angle between the second embedded portion 44 and the vertical section 46 may be an obtuse angle). The second embedded portion 44 is provided with a second cross-sectional surface 442 corresponding to the first cross-sectional surface 352, and a size of the second cross-sectional surface 442 is equal to a size of the first cross-sectional surface 352 (and in other embodiments, the size of the second cross-sectional surface 442 may be greater than or less than the size of the first cross-sectional surface 352).

As shown in FIG. 15 to FIG. 18, the second embedded portion 44 further has a first bending portion 443 and an extending portion 444 extending obliquely from the first bending portion 443 toward one side adjacent to the fixing portion 2. One end of the first bending portion 443 adjacent to the vertical section 46 is connected to the first vertical section 461, and one end of the first bending portion 443 away from the vertical section 46 is connected to the extending portion 444. One side of the extending portion 444 away from the vertical section 46 is connected to the second cross-sectional surface 442. The insulating block c' wraps outside the extending portion 444, and a portion of the insulating block c' is located between the extending portion 444 and the vertical section 46. When the terminal b' is mated with the first electronic component B and the second electronic component C, the extending portion 444 is used to stop the insulating block c' from moving toward one side away from the floating contact portion 4. A portion of the first bending portion 443 adjacent to the extending portion 444 is embedded in the insulating block c, and another portion thereof is exposed out of the insulating block c', such that a slit P3 exists between the insulating block c' and the first vertical portion 461. When the terminal b' is mated with the first electronic component B and the second electronic component C, the portion of the first bending portion 443 being embedded in the insulating block c' may be used to stop the insulating block c' from moving toward one side away from the floating contact portion 4, and another portion of the first bending portion 443 being exposed out of the insulating block c' is located below the slit P3. The slit P3 may be reserved for the second vertical portion 462, such that the second vertical portion 462 may move toward the slit P3.

As shown in FIG. 15 to FIG. 18, the second embedded portion 44 is further provided with a second bending portion 445 and an extension portion 446 corresponding to the first bending portion 443 and the extending portion 444. The second bending portion 445 is located below the first bending portion 443, and the extension portion 446 is located below the extending portion 444. One end of the second bending portion 445 adjacent to the vertical section 46 is connected to the second vertical portion 462, and one end of the second bending portion 445 away from the vertical section 46 is connected to the extension portion 446. One end of the extension portion 446 away from the vertical section 46 is connected to the second cross-sectional surface 442. The extension portion 446 and the second bending portion 445 are both embedded in the insulating block c'. In other words, the extension portion 446 is completely embedded in the insulating block c', and the second bending portion 445 is also completely embedded in the insulating block c', such that there is no gap between the insulating block c' and the second vertical portion 462. When the terminal b' is mated with the first electronic component B and the second electronic component C, the extension portion 446 and the second bending portion 445 altogether stop the insulating block c, thus preventing the insulating block c' from moving toward one side away from the conduction portion 66.

As shown in FIG. 15 to FIG. 18, the lower contact portion 63 of the conducting portion 6 and the upper contact portion 41 are provided to be staggered along the horizontal direction. Specifically, the lower contact portion 63 is farther away from the fixing portion 2 than the upper contact portion 41 (that is, the lower contact portion 63 is located at a right side of the upper contact portion 41). Thus, when the terminal b' is mated with the first electronic component B and the second electronic component C, the upper contact portion 41 may generate a scratching force to the second electronic component C, such that the upper contact portion 41 may scratch the particles on the second electronic component C, such that the contact between the upper contact portion 41 and the second electronic component C is more stable. The lower contact portion 63 may generate a scratching force to the first electronic component B, such that the lower contact portion 63 may scratch the particles on the first electronic component B, such that the contact between the lower contact portion 63 and the first electronic component B is more stable.

Figure 19:
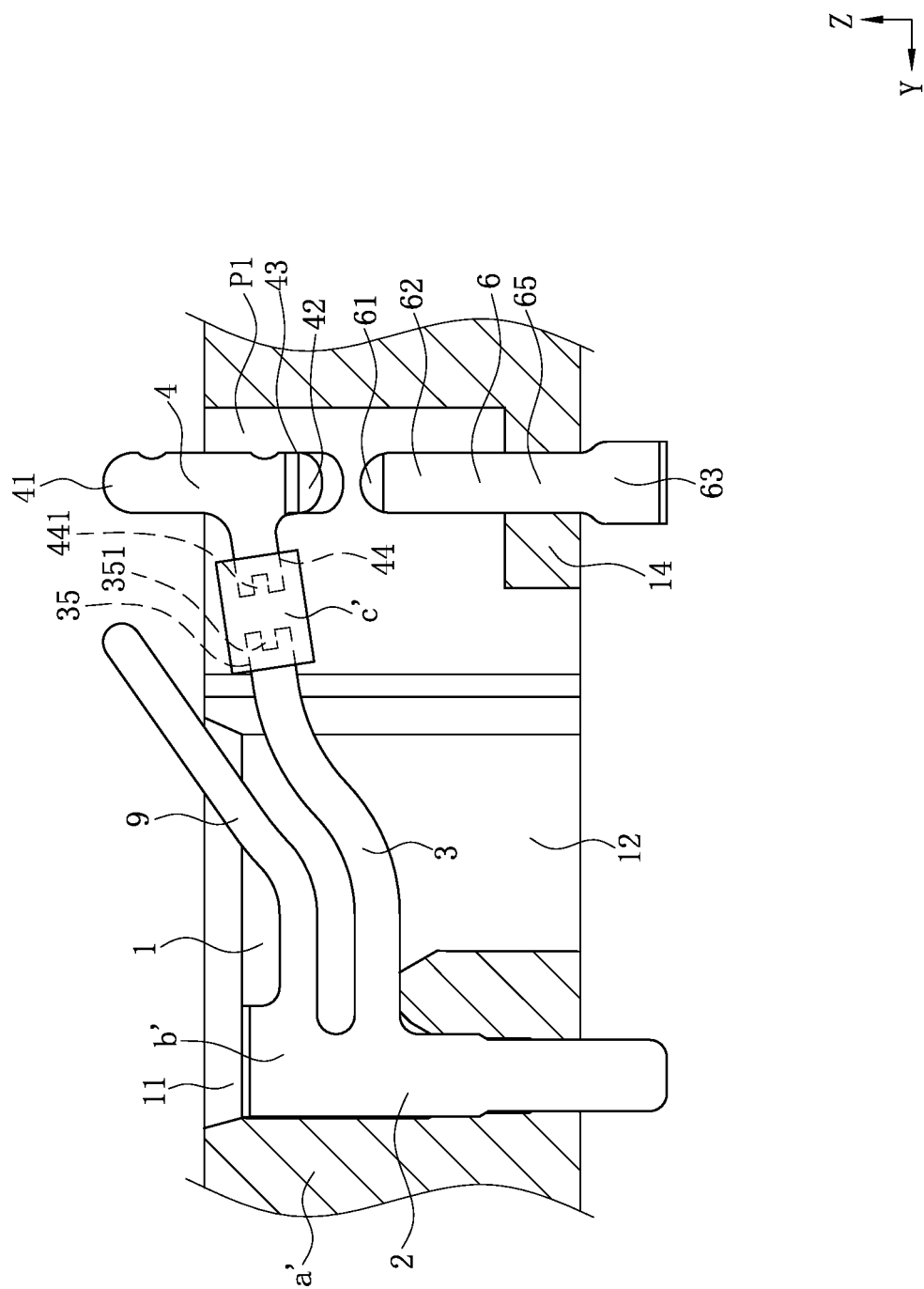
FIG. 19 is a sectional view of the electrical connector before the electrical connector is mated with the first electronic component and the second electronic component according to a seventh embodiment of the present invention.
Figure 20:
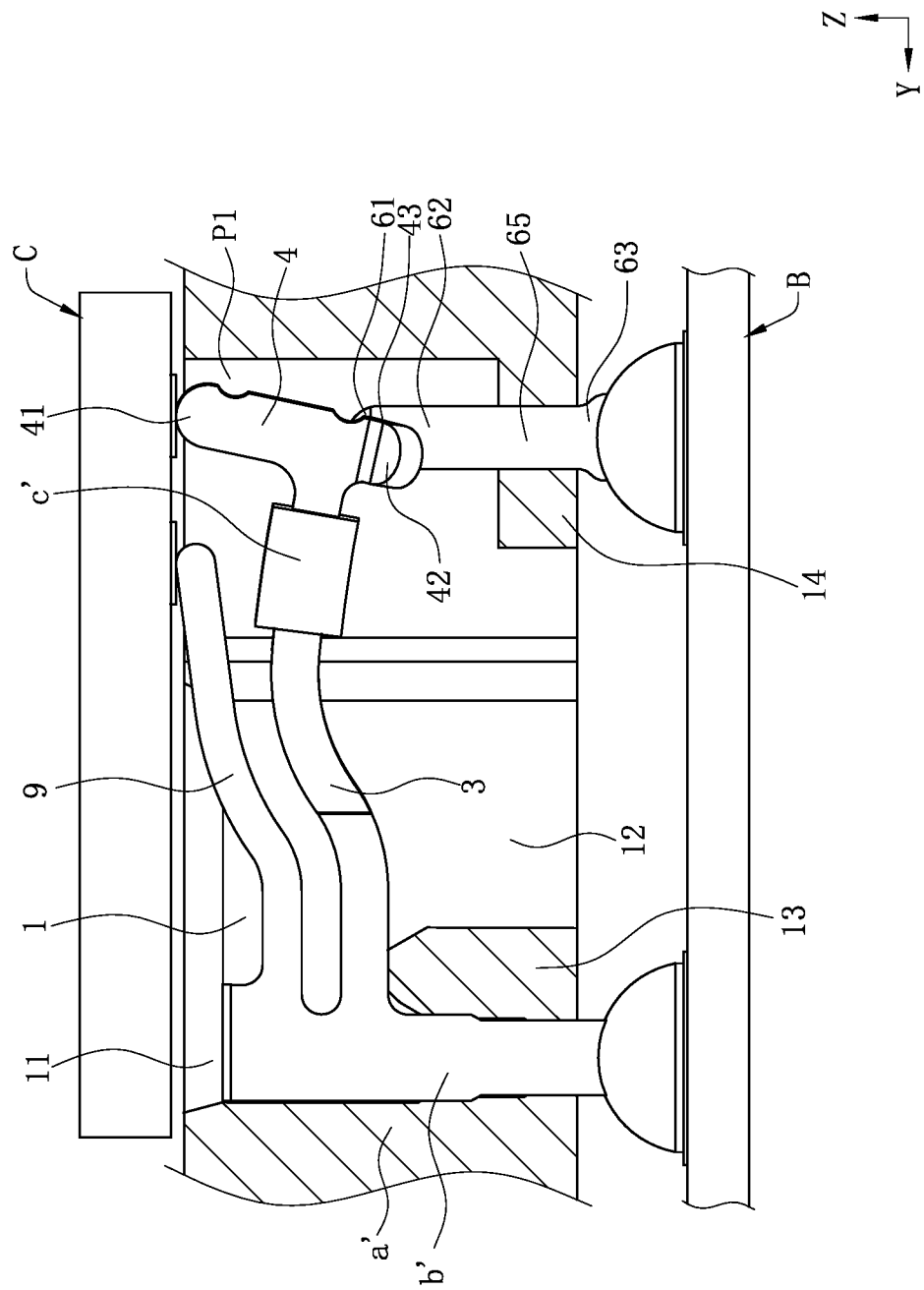
FIG. 20 is a sectional view of the electrical connector when the electrical connector is mated with the first electronic component and the second electronic component according to the seventh embodiment of the present invention.
Figure 21:
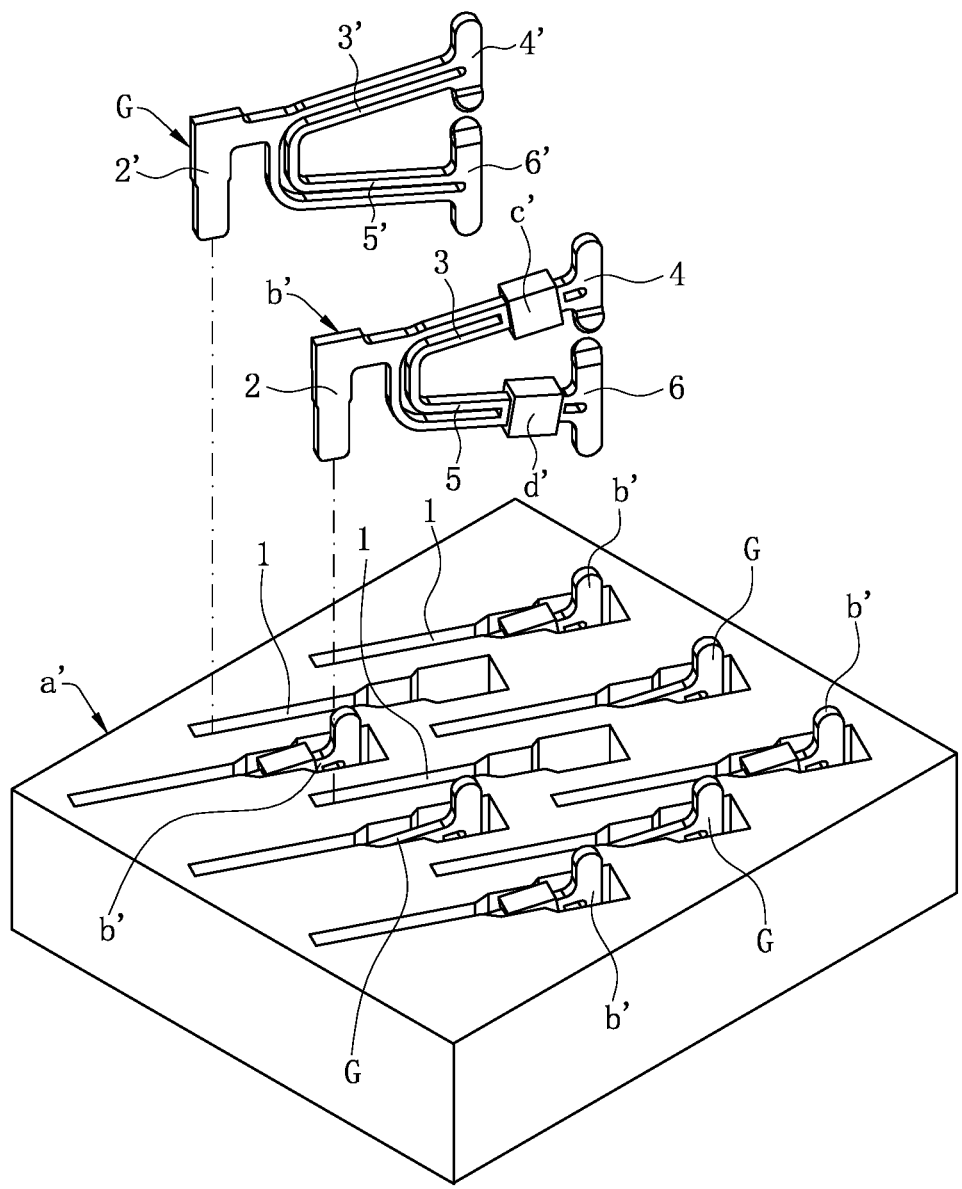
FIG. 21 is a perspective exploded view of an electrical connector according to an eighth embodiment of the present invention.
Figure 22:
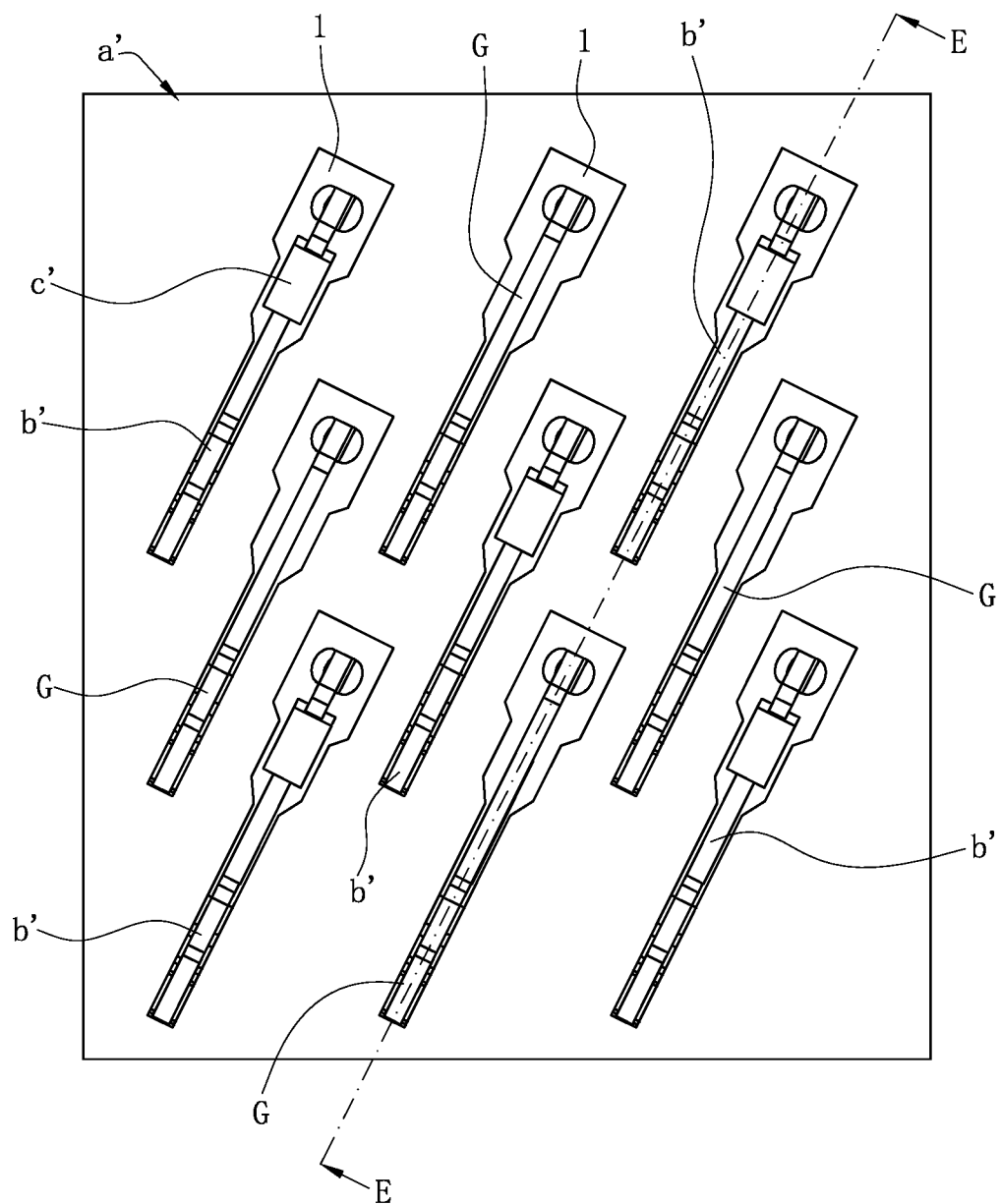
FIG. 22 is a top view of the electrical connector according to the eighth embodiment of the present invention.
Figure 23:
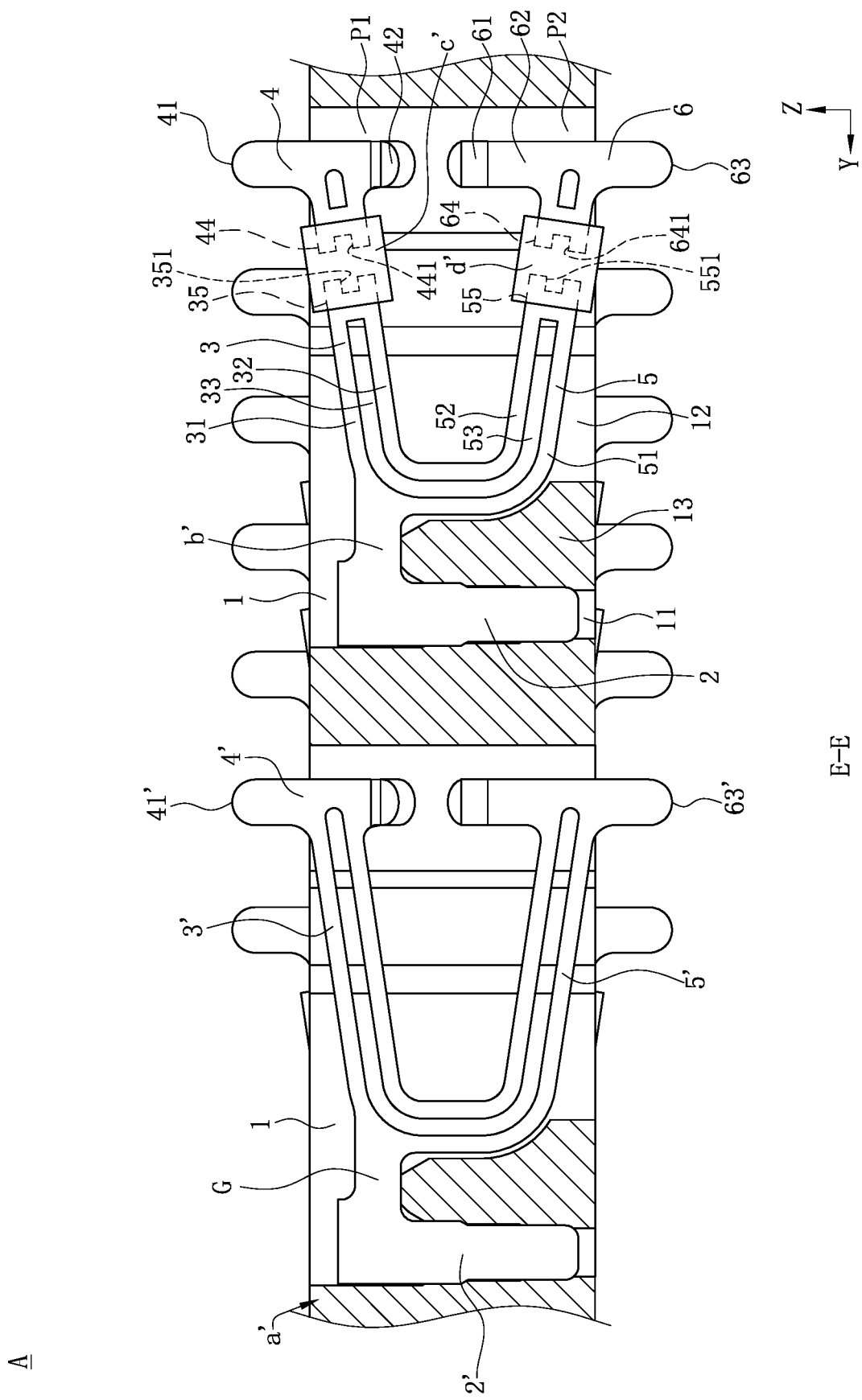
FIG. 23 is a sectional view of FIG. 22 along a line E-E.
Figure 24:
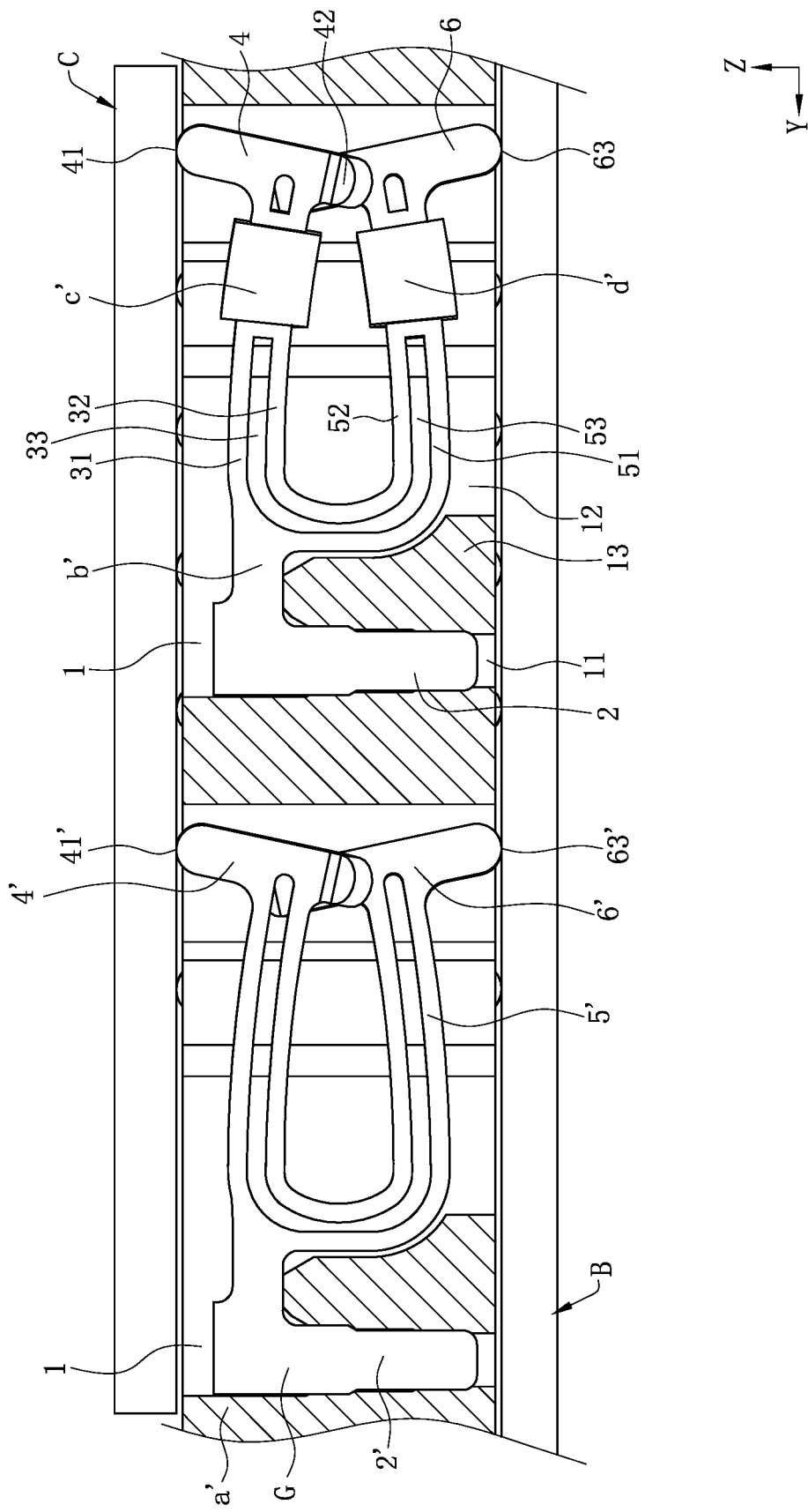
FIG. 24 is a sectional view of the electrical connector when the electrical connector is mated with the first electronic component and the second electronic component according to the eighth embodiment of the present invention.

As shown in FIG. 19 to FIG. 20 show an electrical connector A according to a seventh embodiment, which is different from the electrical connector A according to the second embodiment in that, with the remaining structures and connection relationships being identical to those of the second embodiment: the positioning post 13 in the insulating body a' is not provided with the curve-shaped supporting portion 131, and a side surface of the positioning post 13 away from the fixing cavity 11 is a vertical surface. Each terminal b' has one fixing portion 2, an abutting arm 9, one elastic arm 3, one floating contact portion 4 and one conducting portion 6.

As shown in FIG. 19 to FIG. 20, the fixing portion 2 is inserted into the fixing cavity 11 downward from top thereof, and an upper surface of the fixing portion 2 is lower than an upper surface of the insulating body a'. A lower end of the fixing portion 2 passes downward beyond the fixing cavity 11, and the lower end of the fixing portion 2 is used to be electrically connected to the first electronic component B (and in this embodiment, the lower end of the fixing portion 2 and the first electronic component B are soldered together by a solder. In other embodiments, the lower end of the fixing portion 2 and the first electronic component B may abut each other).

As shown in FIG. 19 to FIG. 20, the abutting arm 9 is located above the elastic arm 3, and one end of the abutting arm 9 adjacent to the fixing portion 2 is connected to the fixing portion 2. A free tail end of the abutting arm 9 away from the fixing portion 2 is exposed upward to the accommodating slot 1 to abut the second electronic component C. That is, an upper end of the abutting arm 9 (i.e., the free tail end of the abutting arm 9) is exposed upward to the accommodating slot 1 to abut the second electronic component C. The free tail end of the abutting arm 9 does not pass rightward beyond the insulating block c. In other words, the free tail end of the abutting arm 9 is farther away from the floating contact portion 4 than the elastic arm 3. Thus, even when the abutting arm 9 is pressed and moves downward, the free tail end of the abutting arm 9 abuts the insulating block c' and is not in contact with the floating contact portion 4.

As shown in FIG. 19 to FIG. 20, the elastic arm 3 is not provided with the elongated slot 33 and the stopping portion 34. That is, the elastic arm 3 is not provided with the first elastic portion 31 and the second elastic portion 32 that may relatively deform. In other words, the elastic arm 3 is single-beam type. One end of the elastic arm 3 adjacent to the fixing portion 2 is connected to the fixing portion 2, and one end of the elastic arm 3 away from the fixing portion 2 is provided with the first embedded portion 35. The insulating block c' is insert-molded and wraps outside the first embedded portion 35.

As shown in FIG. 19 to FIG. 20, when the terminal b' is mated with the first electronic component B and the second electronic component C, the free tail end of the abutting arm 9 and a grounding pad of the second electronic component C are in contact with each other, and a lower end of the fixing portion 2 and a grounding pad of the first electronic component B are in contact with each other through the solder, such that the grounding signals of the first electronic component B and the grounding signals of the second electronic component C may be transmitted through the abutting arm 9 and the fixing portion 2. The floating contact portion 4 abuts the signal contact point of the second electronic component C through the upper contact portion 41, the conducting portion 6 is in contact with the first electronic component B through the lower contact portion 63, and the floating contact portion 4 is further in direct contact with the second contact surface 62 of the conducting portion 6 through the second contact surface 43, such that the signals of the first electronic component B and the signals of the second electronic component C may be transmitted through the floating contact portion 4 and the conducting portion 6.

FIG. 21 to FIG. 24 show an electrical connector A according to an eighth embodiment, which is different from the electrical connector A according to the first embodiment in that, with the remaining structures and connection relationships being identical to those of the first embodiment: the electrical connector A further has a plurality of ground contacts G. The terminals b' and the ground contacts G are provided to be adjacent to each other. Specifically, each of a left side and a right side of a terminal b' is provided with a ground contact G, and each of a front side and a rear side of the terminal b' is also provided with a ground contact G (and in other embodiments, it is possible that each of the left side and the right side of a terminal b' is provided with a ground contact G, and there is no ground contact G at each of the front side and the rear side of the terminal b'; or that there is no ground contact G at each of the left side and the right side of the terminal b', and each of the front side and the rear side of the terminal b' is provided with a ground contact G).

As shown in FIG. 21 to FIG. 24, the elastic arm 3 and the floating contact portion 4 of each terminals b' are provided at an interval, and one end of the elastic arm 3 adjacent to the floating contact portion 4 is connected to the floating contact portion 4 through the insulating block c'. Further, the deformation arm 5 and the conducting portion 6 of each terminals b' are provided at an interval, and one end of the deformation arm 5 adjacent to the conducting portion 6 is connected to the conducting portion 6 through the plastic block d'.

As shown in FIG. 21 to FIG. 24, each ground contact G has a grounding fixing portion 2', a grounding elastic arm 3', a movable contact portion 4', a grounding deformation arm 5' and a grounding conducting portion 6'. One end of the grounding elastic arm 3' of each ground contact G adjacent to the movable contact portion 4' is connected to the movable contact portion 4', and one end of the grounding deformation arm 5' of each ground contact G adjacent to the grounding conducting portion 6' is connected to the grounding conducting portion 6'. In other words, signals of the grounding elastic arm 3' and the movable contact portion 4' of each ground contact G are conductively connected, and signals of the grounding deformation arm 5' and the grounding conducting portion 6' of each ground contact G are conductively connected.

As shown in FIG. 21 to FIG. 24, when the terminal b' is mated with the first electronic component B and the second electronic component C, the floating contact portion 4 of each terminals b' abuts a signal contact point of the second electronic component C through the upper contact portion 41, and the conducting portion 6 of each terminals b' abuts a signal contact point of the first electronic component B through the lower contact portion 63, such that the signals of the first electronic component B and the signals of the second electronic component C may be transmitted through the floating contact portion 4 and the conducting portion 6 of each terminals b'. The movable contact portion 4' of each ground contact G abuts a grounding pad of the second electronic component C through an upper grounding contact portion 41', and the movable contact portion 4' may directly transmit the grounding signals of the second electronic component C to the grounding elastic arm 3' and the grounding conducting portion 6'. The grounding conducting portion 6' of each ground contact G abuts a grounding pad of the first electronic component B through a lower grounding contact portion 63', and the grounding conducting portion 6' may directly transmit the grounding signals of the first electronic component B to the grounding deformation arm 5' and the movable contact portion 4'. Thus, the grounding signals of the first electronic component B and the grounding signals of the second electronic component C may be transmitted through the movable contact portion 4', the grounding elastic arm 3', the grounding conducting portion 6' and the grounding deformation arm 5'. Further, each of the front and rear sides and each of the left and right sides of one terminal b' is provided with a ground contact G. Thus, the ground contacts G may shield the signal interference between two adjacent terminals b', such that the electrical connector A has good high frequency characteristics.

In sum, the electrical connector A according to certain embodiments of the present invention has the following beneficial effects:

(1) The elastic arm 3 and the floating contact portion 4 are provided at an interval, and one end of the elastic arm 3 is connected with the floating contact portion 4 through an insulating block c'. Thus, the signals of the first electronic component B and the signals the second electronic component C are not transmitted to the elastic arm 3, further preventing the signals from being transmitted to the elastic arm 3 and diffusing to the surrounding to interfere with signals of the adjacent terminals b', such that the electrical connector A has good high frequency characteristics. Further, when the terminal b' is mated with the first electronic component B and the second electronic component C, the elastic arm 3 provides an elastic force such that the floating contact portion 4 moves along the vertical direction, and the floating contact portion 4 and the conducting portion 6 are directly electrically connected. Thus, the signals of the first electronic component B and the signals the second electronic component C are transmitted only through the floating contact portion 4 and the conducting portion 6, without requiring the floating contact portion 4 and the conducting portion 6 to be mated with a third component, thus preventing from the case where the floating contact portion 4 and the third component are not in stable contact and the conducting portion 6 and the third component are not in stable contact, such that the electrical connector A has good high frequency characteristics.

(2) The conducting portion 6 and the elastic arm 3 are not electrically connected, thus preventing the conducting portion 6 from transmitting the signals of the first electronic component B and the signals the second electronic component C to the elastic arm 3 and causing crosstalk to the adjacent terminals b'. Further, the conducting portion 6 is exposed downward out of the accommodating slot 1 to be soldered to the first electronic component B, such that the contact between the conducting portion 6 and the first electronic component B is more stable.

(3) The first guiding portion 42 and the second guiding portion 61 are mated with each other, such that the plate surface of the floating contact portion 4 and the plate surface of the conducting portion 6 are in contact with each other, thus preventing the floating contact portion 4 and the conducting portion 6 from colliding with each other and being damaged after being pressed.

(4) The elongated slot 33 is located between the first elastic portion 31 and the second elastic portion 32, such that the first elastic portion 31 may generate elastic deformation relative to the second elastic portion 32, or the second elastic portion 32 may generate elastic deformation relative to the first elastic portion 31, thereby increasing the elasticity of the elastic arm 3. Further, an upper end of the stopping portion 34 is connected to the first elastic portion 31, a lower end of the stopping portion 34 is connected to the second elastic portion 32, and the stopping portion 34 is at least partially exposed out of the insulating block c', thus preventing from the case where when the insulating block c' is formed, the insulating material flows into the elongated slot 33 and results in deformation of the insulating block c'.

(5) The insulating block c' is formed by insert-molding and wraps outside the first embedded portion 35 and the second embedded portion 44, and portions of the insulating material of the insulating block c' pass through the first through slot 351 and the second through slot 441, such that there is a strong bonding force between the insulating block c' and the first embedded portion 35, and there is a strong bonding force between the insulating block c' and the second embedded portion 44, further preventing the elastic arm 3 and the insulating block c' from being separated, and preventing the floating contact portion 4 and the insulating block c' from being separated.

(6) When the terminal b' is mated with the first electronic component B and the second electronic component C, the floating contact portion 4 moves downward and deflects along the clockwise direction. Thus, the floating contact portion 4 may scratch the particles on the second electronic component C, such that the contact between the floating contact portion 4 and the second electronic component C is more stable. The insulating block c' is located between the elastic arm 3 and the conducting portion 6 to separate the elastic arm 3 and the conducting portion 6, preventing the elastic arm 3 from being electrically connected to the conducting portion 6, and further preventing the signals being transmitted to the elastic arm 3 from causing crosstalk for the adjacent terminals b'.

(7) One end of the deformation arm 5 adjacent to the conducting portion 6 is connected to the conducting portion 6 through the plastic block d'. Thus, the deformation arm 5 may provide elasticity to the conducting portion 6, such that the conducting portion 6 may move vertically, and the signals of the first electronic component B and the signals the second electronic component C are not transmitted to the deformation arm 5 to cause crosstalk to the adjacent terminals b'.

(8) The first gap P1 exists between one side of the floating contact portion 4 away from the elastic arm 3 and the inner wall surface of the accommodating slot 1, and the second gap P2 exists between one side of the conducting portion 6 away from the deformation arm 5 and the inner wall surface of the accommodating slot 1. When the terminal b' is mated with the first electronic component B and the second electronic component C, the floating contact portion 4 deflects along the clockwise direction and protrudes into the first gap P1, and the conducting portion 6 deflects along the counter-clockwise direction and protrudes into the second gap P2. Thus, the first gap P1 may be reserved for the floating contact portion 4, and the second gap P2 may be reserved for the conducting portion 6. The floating contact portion 4 deflects along the clockwise direction, which may scratch the particles on the second electronic component C, such that the contact between the floating contact portion 4 and the second electronic component C is more stable. The conducting portion 6 deflects along the counter-clockwise direction, which may scratch the particles on the first electronic component B, such that the contact between the conducting portion 6 and the first electronic component B is more stable.

(9) When the terminal b' is given a force, the insulating block c' and the plastic block d' abut each other, thus preventing the terminal b' from being excessively pressed and deforming such that the elastic arm 3 and deformation arm 5 are damaged and cannot return to the original state. Further, one end of the insulating block c' adjacent to the floating contact portion 4 is used to stop the conducting portion 6, and one end of the plastic block d' adjacent to the conducting portion 6 is used to stop the floating contact portion 4, thus preventing the conducting portion 6 from being electrically connected to the elastic arm 3, preventing the deformation arm 5 from being electrically connected to the floating contact portion 4, and further preventing the signals of the first electronic component B and the signals the second electronic component C from being transmitted to the elastic arm 3 and the deformation arm 5, and causing crosstalk to the adjacent terminals b'.

(10) The first contact surface 43 is located between the insulating block c' and the second contact surface 62, thus preventing the floating contact portion 4 and the conducting portion 6 from being in contact with the elastic arm 3 when being pressed, and further preventing the signals of the first electronic component B and the signals the second electronic component C from being transmitted to the elastic arm 3 and causing crosstalk to the adjacent terminals b'.

(11) The conducting portion 6 and the floating contact portion 4 are integrally provided, and the first connecting portion 7 and the second connecting portion 8 are provided to form an angle therebetween, thus providing elastic forces to the floating contact portion 4 and the conducting portion 6, such that the floating contact portion 4 and the conducting portion 6 may move vertically.

(12) A gap exists between the first connecting portion 7 and the fixing portion 2, and a gap exists between the second connecting portion 8 and the fixing portion 2, thus preventing the fixing portion 2 from being in contact with the first connecting portion 7, preventing the fixing portion 2 from being in contact with the second connecting portion 8, and further preventing the signals of the first electronic component B and the signals the second electronic component C from being transmitted to the fixing portion 2, and causing crosstalk to the adjacent terminals b'.

(13) A distance from the insulating block c' to the first connecting portion 7 is less than a distance from the elastic arm 3 to the first connecting portion 7, and a distance from the plastic block d' to the second connecting portion 8 is less than a distance from the deformation arm 5 to the second connecting portion 8. Thus, when the terminal b' is mated with the first electronic component B and the second electronic component C, the first connecting portion 7 is prevented from being conductively connected to the elastic arm 3, the second connecting portion 8 is prevented from being conductively connected to the deformation arm 5, and further preventing the signals of the first electronic component B and the signals the second electronic component C from being transmitted to the elastic arm 3 and the deformation arm 5, and causing crosstalk to the adjacent terminals b'.

(14) A distance from the insulating block c' to the oblique section 47 is less than a distance from the elastic arm 3 to the oblique section 47. Thus, when the oblique section 47 is pressed and moves downward, the oblique section 47 is not in contact with the elastic arm 3, and instead, the oblique section 47 firstly abuts the insulating block c', thus preventing the oblique section 47 from being electrically connected to the elastic arm 3, and further preventing the signals of the first electronic component B and the signals the second electronic component C from being transmitted to the elastic arm 3, and causing crosstalk to the adjacent terminals b'.

(15) Along the horizontal direction, the lower contact portion 63 and the upper contact portion 41 are staggered. Thus, the upper contact portion 41 may scratch the particles generated by the second electronic component C, such that the contact between the upper contact portion 41 and the second electronic component C is more stable; the lower contact portion 63 may scratch the particles generated by the first electronic component B, such that the contact between the lower contact portion 63 and the first electronic component B is more stable.

(16) The first bending portion 353 bends downward and extends from the first embedded portion 35 toward one side away from the floating contact portion 4, and the second bending portion 354 bends downward and extends from a lower end of the first bending portion 353 toward one side adjacent to the floating contact portion 4. Thus, the first bending portion 353 and the second bending portion 354 may allow the floating contact portion 4 and the conducting portion 6 to move vertically. Further, when the terminal b' is mated with the first electronic component B and the second electronic component C, the second bending portion 354 upward abuts the insulating block c', thus preventing the second bending portion 354 from being pressed to deform and be electrically connected to the floating contact portion 4 or the conducting portion 6, and further preventing the signals of the first electronic component B and the signals the second electronic component C from being transmitted to the elastic arm 3, and causing crosstalk to the adjacent terminals b'.

(17) The first bending portion 443 is partially exposed out of the insulating block c' such that the slit P3 is located between the insulating block c' and the first vertical portion 461. The second bending portion 445 is connected to the second vertical portion 462, and the second bending portion 445 is embedded in the insulating block c', such that there is no gap between the insulating block c' and the second vertical portion 462. Thus, there is a strong bonding force between the insulating block c' and the first embedded portion 35, and the slit P3 may be reserved for the first vertical portion 461, thus preventing the first vertical portion 461 from being given an excessive force and breaking.

(18) When the terminal b' is mated with the first electronic component B and the second electronic component C, the fixing portion 2 and the first electronic component B are electrically connected, and the abutting arm 9 and the second electronic component C are electrically connected, such that the grounding signals of the first electronic component B and the grounding signals of the second electronic component C may be transmitted through the abutting arm 9 and the fixing portion 2.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to electrically connect a first electronic component to a second electronic component, the electrical connector comprising: an insulating body, provided with a plurality of accommodating slots; and a plurality of terminals accommodated in the accommodating slots, wherein each of the terminals has an elastic arm, a floating contact portion and a conducting portion, the elastic arm and the floating contact portion of at least one of the terminals are provided at an interval, and one end of the elastic arm is connected with the floating contact portion through an insulating block;

wherein when each of the terminals is mated with the first electronic component and the second electronic component, the conducting portion is electrically connected to the first electronic component, the floating contact portion is electrically connected to the second electronic component, the elastic arm provides an elastic force such that the floating contact portion moves along downward, and the floating contact portion and the conducting portion are directly electrically connected;

wherein the conducting portion and the elastic arm are not electrically connected, and the conducting portion of each of the terminals is downward exposed out of a corresponding one of the accommodating slots.

2. The electrical connector according to claim 1, wherein along a direction perpendicular to a plate surface of each of the terminals, a lower end of the floating contact portion has a first guiding portion formed by bending, an upper end of the conducting portion is provided with a second guiding portion corresponding to the first guiding portion, and when each of the terminals is mated with the first electronic component and the second electronic component, the first guiding portion and the second guiding portion are mated with each other, such that a plate surface of the floating contact portion and a plate surface of the conducting portion are in contact with each other.

3. The electrical connector according to claim 1, wherein when each of the terminals is mated with the first electronic component and the second electronic component, the floating contact portion moves downward and deflects along a clockwise direction, and the insulating block is located between the elastic arm and the conducting portion to separate the elastic arm and the conducting portion.

4. The electrical connector according to claim 1, wherein the floating contact portion has two clamping portions, the conducting portion is located between the two clamping portions, and the conducting portion is respectively in contact with the two clamping portions.

5. The electrical connector according to claim 1, wherein the floating contact portion does not pass downward beyond the insulating block, one side of the floating contact portion away from the elastic arm has a first contact surface, the conducting portion has a second contact surface corresponding to the first contact surface, the first contact surface is located between the insulating block and the second contact surface, and when each of the terminals is mated with the first electronic component and the second electronic component, the first contact surface is in contact with the second contact surface.

6. The electrical connector according to claim 1, wherein the floating contact portion has a vertical section and an oblique section bending and extending from the vertical section toward one side adjacent to the elastic arm, the insulating block is located below the oblique section, and a distance from the insulating block to the oblique section is less than a distance from the elastic arm to the oblique section.

7. The electrical connector according to claim 1, wherein the conducting portion and the floating contact portion are integrally provided, the conducting portion has a lower contact portion exposed downward out of a corresponding one of the accommodating slots, the lower contact portion is configured to be in contact with the first electronic component, the floating contact portion has an upper contact portion exposed upward out of the corresponding one of the accommodating slots, the upper contact portion is configured to be in contact with the second electronic component, and the lower contact portion and the upper contact portion are staggered along a horizontal direction.

8. The electrical connector according to claim 1, wherein the elastic arm, the floating contact portion and the conducting portion are all located on a same vertical plane, an upper end of the conducting portion is connected to a lower end of the floating contact portion, the elastic arm has a first embedded portion, the floating contact portion is provided with a second embedded portion corresponding to the first embedded portion, the first embedded portion has a first cross-sectional surface facing the second embedded portion, the second embedded portion has a second cross-sectional surface corresponding to the first cross-sectional surface, and a size of the first cross-sectional surface is equal to a size of the second cross-sectional surface.

9. The electrical connector according to claim 1, wherein the elastic arm has a first embedded portion provided in the insulating block, a first bending portion is provided to bend and extend downward from the first embedded portion toward one side away from the floating contact portion, a second bending portion is provided to bend and extend downward from a lower end of the first bending portion toward one side adjacent to the floating contact portion, and when each of the terminals is mated with the first electronic component and the second electronic component, the second bending portion upward abuts the insulating block.

10. The electrical connector according to claim 1, wherein each of the terminals has a fixing portion and an abutting arm, the fixing portion is downward exposed to a corresponding one of the accommodating slots, the abutting arm is upward exposed to the corresponding one of the accommodating slots, one of the abutting arm adjacent to the fixing portion is connected to the fixing portion, and when each of the terminals is mated with the first electronic component and the second electronic component, the fixing portion is electrically connected to the first electronic component, and the abutting arm is electrically connected to the second electronic component.

11. The electrical connector according to claim 1, wherein the elastic arm has a first elastic portion and a second elastic portion located at an inner side of the first elastic portion, the elastic arm has an elongated slot and a stopping portion, the elongated slot is located between the first elastic portion and the second elastic portion, an upper end of the stopping portion is connected to the first elastic portion, a lower end of the stopping portion is connected to the second elastic portion, and the stopping portion is at least partially exposed out of the insulating block.

12. The electrical connector according to claim 11, wherein the elastic arm has a first embedded portion, the first embedded portion is located at one side of the stopping portion adjacent to the floating contact portion, the first embedded portion is provided with a first through slot running through the first embedded portion, the stopping portion is located between the first through slot and the elongated slot, the floating contact portion has a second embedded portion corresponding to the first embedded portion, the second embedded portion is provided with a second through slot running through the second embedded portion, the insulating block is insert-molded and wraps the first embedded portion and the second embedded portion, and an insulating material of the insulating block partially passes through the first through slot and the second through slot.

13. The electrical connector according to claim 1, wherein each of the terminals has a deformation arm located below the elastic arm and connected to the elastic arm, the conducting portion and the deformation arm are provided at an interval, one side of the deformation arm adjacent to the conducting portion is connected to the conducting portion through a plastic block, and when each of the terminals is mated with the first electronic component and the second electronic component, the deformation arm provides an elastic force to move upward.

14. The electrical connector according to claim 13, wherein for each of the terminals, a first gap exists between one side of the floating contact portion away from the elastic arm and an inner wall of a corresponding one of the accommodating slots, a second gap exists between one side of the conducting portion away from the deformation arm and the inner wall of the corresponding one of the accommodating slots, and when each of the terminals is mated with the first electronic component and the second electronic component, the floating contact portion deflects along a clockwise direction and enters the first gap, and the conducting portion deflects along a counterclockwise direction and enters the second gap.

15. The electrical connector according to claim 13, wherein the insulating block and the plastic block are aligned along a vertical direction, when each of the terminals is subject to a force, the insulating block and the plastic block abut each other, one end of the insulating block adjacent to the floating contact portion is configured to stop the conducting portion, and one end of the plastic block adjacent to the conducting portion is configured to stop the floating contact portion.

16. The electrical connector according to claim 1, wherein the conducting portion and the floating contact portion are integrally provided, each of the terminals has a first connecting portion and a second connecting portion, the second connecting portion is located below the first connecting portion and is connected to a lower end of the first connecting portion, an upper end of the first connecting portion is connected to a lower end of the floating contact portion, a lower end of the second connecting portion is connected to the conducting portion, and the first connecting portion and the second connecting portion are provided to form an angle therebetween.

17. The electrical connector according to claim 16, wherein each of the terminals has a fixing portion, the fixing portion is located at one end of the elastic arm away from the floating contact portion and is connected to the elastic arm, and when each of the terminals is mated with the first electronic component and the second electronic component, the first connecting portion and the second connecting portion move toward one side adjacent to the fixing portion, a gap exists between the first connecting portion and the fixing portion, and a gap exists between the second connecting portion and the fixing portion.

18. The electrical connector according to claim 16, wherein each of the terminals has a deformation arm, the deformation arm and the conducting portion are provided at an interval, one side of the deformation arm adjacent to the conducting portion is connected to the conducting portion through a plastic block, and along a horizontal direction, a distance from the insulating block to the first connecting portion is less than a distance from the elastic arm to the first connecting portion, and a distance from the plastic block to the second connecting portion is less than a distance from the deformation arm to the second connecting portion.

19. The electrical connector according to claim 1, wherein the elastic arm has a first embedded portion, the first embedded portion is provided in the insulating block, the floating contact portion has a vertical section and a second embedded portion extending obliquely from the vertical section toward one side adjacent to the elastic arm, the second embedded portion is partially exposed out of the insulating block, such that a slit exists between the insulating block and the vertical section, and when each of the terminals is mated with the first electronic component and the second electronic component, the slit is reserved for the vertical section.

20. The electrical connector according to claim 19, wherein each of the terminals has a fixing portion, the second embedded portion is provided with a first bending portion and an extending portion extending obliquely from the first bending portion toward one side adjacent to the fixing portion, the insulating block wraps outside the extending portion, the insulating block is partially located between the extending portion and the vertical section, the insulating block at least partially wraps outside the first bending portion, the insulating block is partially located between the first bending portion and the vertical section, and when each of the terminals is mated with the first electronic component and the second electronic component, the extending portion is configured to stop the insulating block from moving toward one side away from the floating contact portion, and the first bending portion is configured to stop the insulating block from moving toward one side away from the floating contact portion.

21. The electrical connector according to claim 19, wherein the vertical section has a first vertical portion and a second vertical portion located below the first vertical portion, a width of the second vertical portion is greater than a width of the first vertical portion, the second embedded portion is provided with a first bending portion and a second bending portion, the first bending portion is located above the second bending portion, the first bending portion is connected to the first vertical portion, the first bending portion is partially exposed out of the insulating block such that the slit is located between the insulating block and the first vertical portion, the second bending portion is connected to the second vertical portion, and the second bending portion is embedded in the insulating block such that no gap exists between the insulating block and the second vertical portion.

* * * * *